United States Patent
Kawasaki

(10) Patent No.: US 11,323,645 B2
(45) Date of Patent: May 3, 2022

(54) SOLID-STATE IMAGING ELEMENT AND IMAGING DEVICE WITH LIGHT RECEIVING CHIP AND CIRCUIT CHIP

(71) Applicant: Sony Semiconductor Solutions Corporation, Kanagawa (JP)

(72) Inventor: Ryohei Kawasaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/271,004

(22) PCT Filed: Jul. 23, 2019

(86) PCT No.: PCT/JP2019/028751
§ 371 (c)(1),
(2) Date: Feb. 24, 2021

(87) PCT Pub. No.: WO2020/066245
PCT Pub. Date: Apr. 2, 2020

(65) Prior Publication Data
US 2021/0329188 A1    Oct. 21, 2021

(30) Foreign Application Priority Data
Sep. 26, 2018  (JP) .............................. JP2018-179610

(51) Int. Cl.
*H04N 5/225*  (2006.01)
*H04N 5/374*  (2011.01)
*H04N 5/3745* (2011.01)

(52) U.S. Cl.
CPC ......... *H04N 5/3741* (2013.01); *H04N 5/3742* (2013.01); *H04N 5/37457* (2013.01)

(58) Field of Classification Search
CPC . H04N 5/3741; H04N 5/3742; H04N 5/37457
(Continued)

(56) References Cited

U.S. PATENT DOCUMENTS

2005/0134349 A1* 6/2005 Krishnaswami ....... H03H 11/26
                                                    327/277
2013/0206964 A1   8/2013 Yamashita et al.
(Continued)

FOREIGN PATENT DOCUMENTS

JP   2009-296574 A   12/2009
JP    2012-90330 A    5/2012
(Continued)

OTHER PUBLICATIONS

International Search Report (PCT/ISA/210), International Application No. PCT/JP2019/028751, dated Oct. 9, 2019.
(Continued)

*Primary Examiner* — Usman A Khan
(74) *Attorney, Agent, or Firm* — Michael Best & Friedrich LLP

(57) ABSTRACT

Power consumption is reduced in a solid-state imaging element including a differential input circuit for each pixel. The solid-state imaging element includes a current source circuit, a pair of differential transistors, and a digital signal generating unit. The current source circuit in the solid-state imaging element supplies a predetermined constant current in a case where a predetermined enable signal is input. The pair of differential transistors generates a differential amplified signal using the constant current, the differential amplified signal being obtained by amplifying a difference between an analog signal generated by a pixel circuit and a predetermined reference signal. The digital signal generating unit generates a digital signal from the differential amplified signal.

18 Claims, 23 Drawing Sheets

(58) Field of Classification Search
USPC .................................................. 348/207.99
See application file for complete search history.

(56) References Cited

U.S. PATENT DOCUMENTS

| | | |
|---|---|---|
| 2015/0156433 A1 | 6/2015 | Nomura et al. |
| 2018/0013412 A1 | 1/2018 | Kikuchi et al. |
| 2018/0067152 A1 | 3/2018 | Nakahara |
| 2018/0288345 A1* | 10/2018 | Nakahara ............... H04N 5/357 |
| 2019/0190526 A1* | 6/2019 | Iguchi ................. H03M 1/468 |

FOREIGN PATENT DOCUMENTS

| | | |
|---|---|---|
| JP | 2012-165168 A | 8/2012 |
| WO | 2016/076139 A1 | 5/2016 |
| WO | 2016/136448 A1 | 9/2016 |

OTHER PUBLICATIONS

Notification of Transmittal of the International Search Report and the Written Opinion of the International Searching Authority, or the Declaration (PCT/ISA/220), International Application No. PCT/JP2019/028751, dated Oct. 21, 2019.

Written Opinion of the International Search Authority (PCT/ISA/237), International Application No. PCT/JP2019/028751, dated Oct. 21, 2019.

* cited by examiner

SOLID-STATE IMAGING ELEMENT AND IMAGING DEVICE WITH LIGHT RECEIVING CHIP AND CIRCUIT CHIP

TECHNICAL FIELD

The present technology relates to a solid-state imaging element and an imaging device. More particularly, the present technology relates to a solid-state imaging element and an imaging device that convert an analog signal into a digital signal by using a differential input circuit.

BACKGROUND ART

Conventionally, in a solid-state imaging element or the like, an analog-to-digital conversion circuit that retains, as a digital signal, a counter value when a result of comparison between an analog signal and a ramp signal is inverted is used widely because the analog-to-digital conversion circuit has a simple structure. For example, a solid-state imaging element has been proposed in which a differential input circuit and a data storage unit are arranged for each pixel, the differential input circuit comparing an analog signal and a ramp signal with each other, the data storage unit retaining, as a digital signal, a counter value when an output of the differential input circuit is inverted (see PTL 1, for example).

CITATION LIST

Patent Literature

[PTL 1]
PCT Patent Publication No. WO2016/136448

SUMMARY

Technical Problems

In the above-described conventional technology, a circuit that converts the analog signal into the digital signal is disposed for each pixel, and thereby AD (Analog to Digital) conversion is simultaneously performed in all of pixels. Therefore, the above-described solid-state imaging element reads image data at high speed as compared with a case where an ADC (Analog to Digital Converter) is disposed for each column and AD conversion is performed in row units. However, in this conventional technology, when readout is performed while some of all of the pixels are excluded, no analog signal is input to the differential input circuits of the excluded pixels, but a constant current of a constant current source, which is generally disposed in the differential input circuits, flows also in a period in which there is no input. Therefore, power consumption cannot be reduced sufficiently. Stopping the supply of power supply voltage to the differential input circuits can interrupt the constant current. However, a stop of the supply of the power supply voltage is not desirable because it takes time for the power supply voltage to become stable after the power supply voltage is turned on again.

The present technology has been made in view of such circumstances. It is an object of the present technology to reduce power consumption in a solid-state imaging element including a differential input circuit for each pixel.

Solution to Problems

The present technology has been made to solve the above-described problems. According to a first aspect of the present technology, there are provided a solid-state imaging element and a control method thereof, the solid-state imaging element including a current source circuit configured to supply a predetermined constant current according to a predetermined enable signal, a pair of differential transistors configured to generate a differential amplified signal using the constant current, the differential amplified signal being obtained by amplifying a difference between an analog signal generated by a pixel circuit and a predetermined reference signal, and a digital signal generating unit configured to generate a digital signal from the differential amplified signal. An effect is thereby produced in that the constant current is supplied to the pair of differential transistors according to the enable signal.

In addition, in the first aspect, the current source circuit may include a current source configured to supply the constant current, and a switching element configured to open and close a path between the current source and a common node connected in common to the pair of differential transistors according to the enable signal. An effect is thereby produced in that the path between the common node and the current source is opened and closed according to the enable signal.

In addition, in the first aspect, the pixel circuit may be disposed in a predetermined light receiving chip, and the current source circuit may be disposed in a predetermined circuit chip. An effect is thereby produced in that a circuit scale of the light receiving chip is reduced.

In addition, in the first aspect, the pixel circuit and a part of the current source circuit may be disposed in a predetermined light receiving chip, and a rest of the current source circuit may be disposed in a predetermined circuit chip. An effect is thereby produced in that a circuit scale of the circuit chip is reduced.

In addition, in the first aspect, the current source circuit may include a current source configured to supply a current corresponding to a predetermined bias voltage as the constant current, and a bias voltage supply circuit configured to supply the bias voltage to the current source according to the enable signal. An effect is thereby produced in that the constant current is supplied or interrupted by supplying or stopping the bias voltage.

In addition, in the first aspect, the pixel circuit may be disposed in a predetermined light receiving chip, and the current source circuit may be disposed in a predetermined circuit chip. An effect is thereby produced in that the circuit scale of the light receiving chip is reduced.

In addition, in the first aspect, the pixel circuit and a part of the current source circuit may be disposed in a predetermined light receiving chip, and a rest of the current source circuit may be disposed in a predetermined circuit chip. An effect is thereby produced in that the circuit scale of the circuit chip is reduced.

In addition, in the first aspect, the pixel circuit may include a photoelectric conversion element configured to generate a charge by photoelectric conversion, a floating diffusion layer configured to accumulate the charge and generate a signal of a voltage corresponding to an amount of the charge as the analog signal, and a transfer transistor configured to transfer the charge from the photoelectric conversion element to the floating diffusion layer when given an instruction for transfer. An effect is thereby produced in that an analog signal corresponding to the amount of the transferred charge is generated by photoelectric conversion.

In addition, in the first aspect, the pixel circuit may further include a discharge transistor configured to discharge the charge from the photoelectric conversion element when given an instruction for discharge. An effect is thereby produced in that the charge is discharged from the photoelectric conversion element.

In addition, in the first aspect, the solid-state imaging element may further include a pixel region in which a plurality of pixels each including the pixel circuit is arranged two-dimensionally in a lattice manner, in which one of a pair of pixels adjacent to each other within the pixel region further includes a connecting transistor configured to connect the respective floating diffusion layers of the pair of pixels to each other. An effect is thereby produced in that analog signals are averaged.

In addition, in the first aspect, the solid-state imaging element may further include a pixel region in which a plurality of pixels each including the pixel circuit is arranged two-dimensionally in a lattice manner, in which the current source circuit includes a logic gate configured to generate the enable signal from a row enable signal indicating a row to be enabled among rows of the pixels and a column enable signal indicating a column to be enabled among columns of the pixels. An effect is thereby produced in that each pixel is set in an enabled state or a disabled state.

In addition, in the first aspect, the solid-state imaging element may further include a pixel region in which a pixel block including a plurality of pixels each including the pixel circuit is arranged, in which the plurality of pixels shares a floating diffusion layer, and the pixel circuit includes a photoelectric conversion element configured to generate a charge by photoelectric conversion and a transfer transistor configured to transfer the charge from the photoelectric conversion element to the floating diffusion layer when given an instruction for transfer. An effect is thereby produced in that the plurality of pixels sharing the floating diffusion layer generates analog signals in order.

In addition, in the first aspect, the solid-state imaging element may further include a pixel region in which a pixel block including a plurality of pixels each including the pixel circuit is arranged, in which the current source circuit includes a logic gate configured to generate the enable signal from a row enable signal indicating a row to be enabled among rows of the pixel block and a column enable signal indicating a column to be enabled among columns of the pixel block, and the plurality of pixels within the pixel block shares the logic gate. An effect is thereby produced in that each pixel block is set in an enabled state or a disabled state.

In addition, in the first aspect, the current source circuit may interrupt the constant current when the digital signal is generated. An effect is thereby produced in that power consumption is further reduced.

In addition, according to a second aspect of the present technology, there is provided an imaging device including a current source circuit configured to supply a predetermined constant current according to a predetermined enable signal, a pair of differential transistors configured to generate a differential amplified signal using the constant current, the differential amplified signal being obtained by amplifying a difference between an analog signal generated by a pixel circuit and a predetermined reference signal, a digital signal generating unit configured to generate a digital signal from the differential amplified signal, and a logic circuit configured to process the digital signal. Effects are thereby produced in that the constant current is supplied to the pair of differential transistors according to the enable signal, and in that the digital signal is generated.

DESCRIPTION OF EMBODIMENTS

Modes for carrying out the present technology (which modes will hereinafter be referred to as embodiments) will hereinafter be described. The description will be made in the following order.

1. First Embodiment (Example of Supplying or Interrupting Constant Current according to Enable Signal)

2. Second Embodiment (Example of Supplying or Interrupting Constant Current by Applying or Stopping Bias Voltage according to Enable Signal)

3. Example of Application to Mobile Body

1. First Embodiment

[Example of Configuration of Imaging Device]

Figure 1:
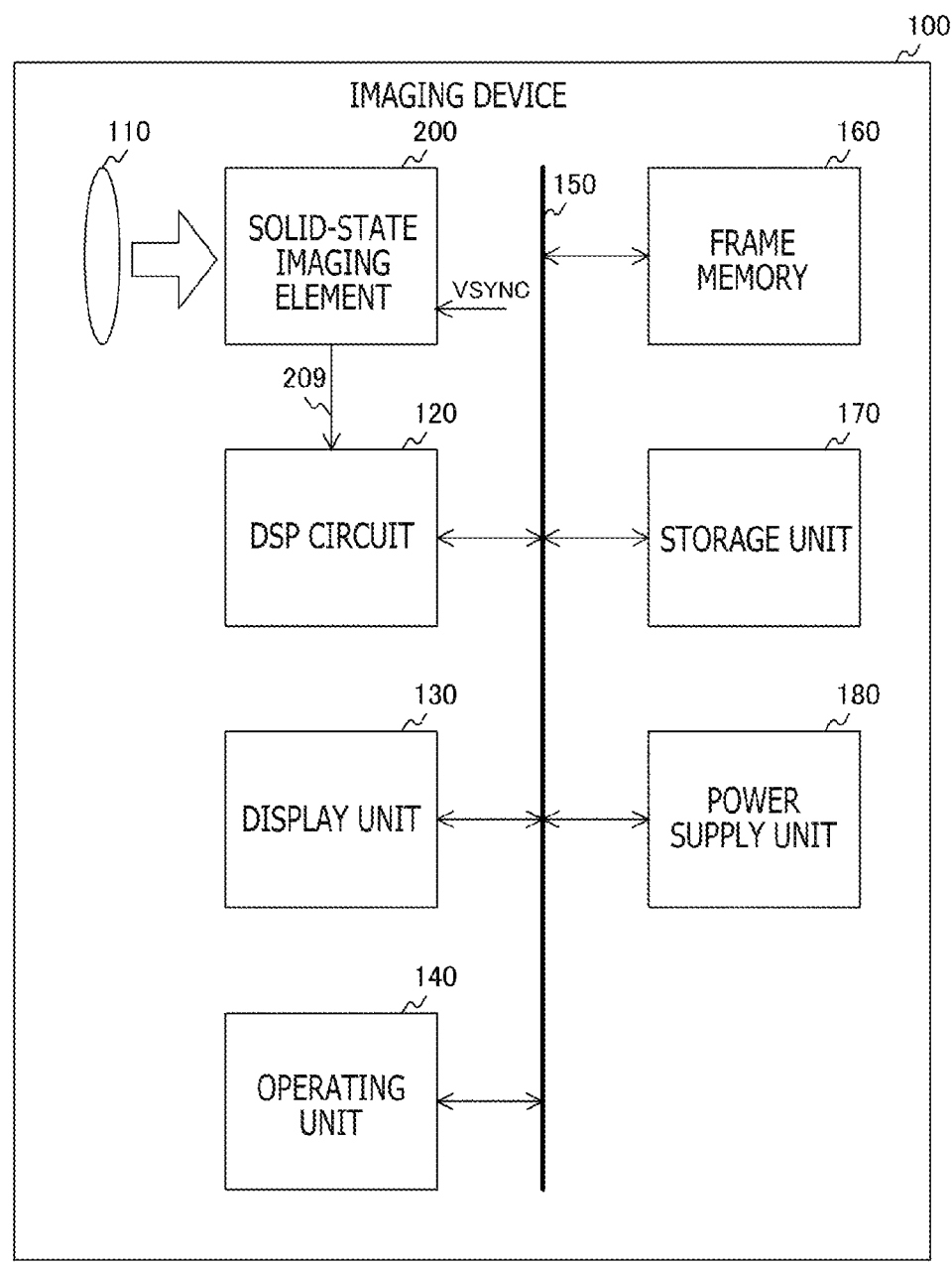
FIG. 1 is a block diagram illustrating one example of configuration of an imaging device in a first embodiment of the present technology.

FIG. 1 is a block diagram illustrating one example of configuration of an imaging device 100 in a first embodiment of the present technology. The imaging device 100 is a device for imaging image data. The imaging device 100 includes an optical unit 110, a solid-state imaging element 200, and a DSP (Digital Signal Processing) circuit 120. The imaging device 100 further includes a display unit 130, an operating unit 140, a bus 150, a frame memory 160, a storage unit 170, and a power supply unit 180. Assumed as the imaging device 100 is, for example, a digital camera such as a digital still camera as well as a smart phone or a personal computer having an imaging function, a vehicle-mounted camera, or the like.

The optical unit 110 condenses light from a subject and guides the light to the solid-state imaging element 200. The solid-state imaging element 200 generates image data by photoelectric conversion in synchronism with a vertical synchronizing signal VSYNC. Here, the vertical synchronizing signal VSYNC is a periodic signal of a predetermined frequency which signal indicates timing of imaging. The solid-state imaging element 200 supplies the generated image data to the DSP circuit 120 via a signal line 209.

The DSP circuit 120 performs predetermined signal processing on the image data from the solid-state imaging element 200. The DSP circuit 120 outputs the image data after the processing to the frame memory 160 and the like via the bus 150.

The display unit 130 displays the image data. A liquid crystal panel or an organic EL (Electro Luminescence) panel, for example, is assumed as the display unit 130. The operating unit 140 generates an operation signal according to operation of a user.

The bus 150 is a common path for the optical unit 110, the solid-state imaging element 200, the DSP circuit 120, the display unit 130, the operating unit 140, the frame memory 160, the storage unit 170, and the power supply unit 180 to exchange data with one another.

The frame memory 160 retains the image data. The storage unit 170 stores various kinds of data such as the image data. The power supply unit 180 supplies power to the solid-state imaging element 200, the DSP circuit 120, the display unit 130, and the like.

[Example of Configuration of Solid-State Imaging Element]

Figure 2:
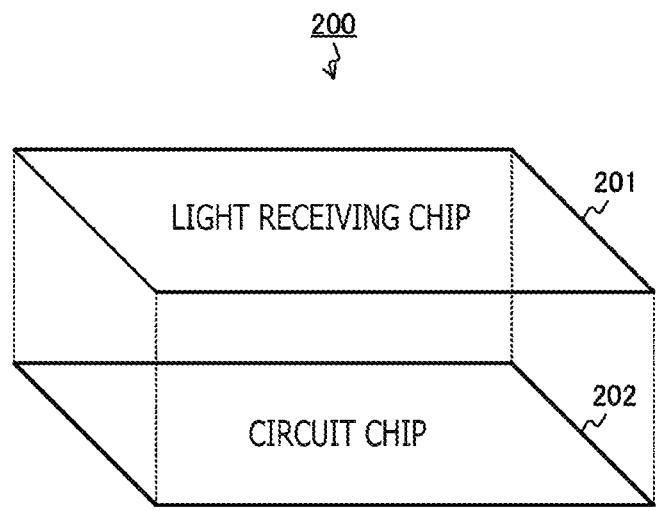
FIG. 2 is a diagram illustrating an example of a laminated structure of a solid-state imaging element in the first embodiment of the present technology.

FIG. 2 is a diagram illustrating an example of a laminated structure of the solid-state imaging element 200 in the first embodiment of the present technology. The solid-state imaging element 200 includes a circuit chip 202 and a light receiving chip 201 stacked on the circuit chip 202. These substrates are electrically connected to each other via connecting portions such as vias. Incidentally, the connection can also be made by Cu—Cu bonding, bumps, or an inductive coupling communication technology such as TCI (ThruChip Interface) in addition to the vias.

Figure 3:
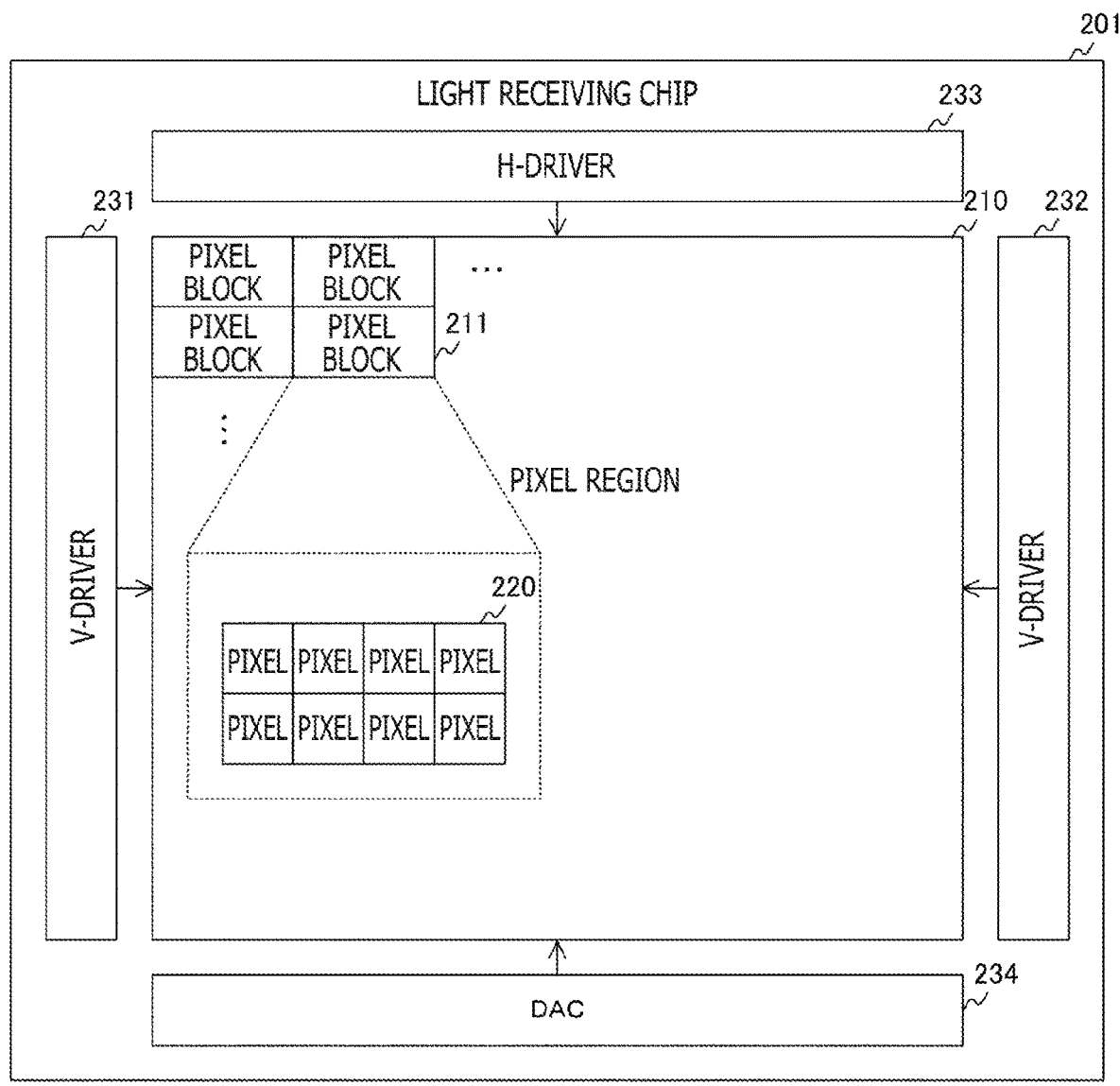
FIG. 3 is a block diagram illustrating one example of configuration of a light receiving chip in the first embodiment of the present technology.

FIG. 3 is a plan view illustrating one example of configuration of the light receiving chip 201 in the first embodiment of the present technology. Arranged in the light receiving chip 201 are a pixel region 210, V-drivers 231 and 232, an H-driver 233, and a DAC (Digital to Analog Converter) 234. In addition, a plurality of pixel blocks 211 is arranged two-dimensionally in a lattice manner in the pixel region 210. A plurality of pixels 220 is arranged in each pixel block 211. For example, eight pixels 220 of two rows×four columns are arranged in the pixel block 211. Incidentally, the number of pixels within the pixel block 211 is not limited to eight.

A pixel 220 generates an analog signal by photoelectric conversion. In addition, a circuit obtained by connecting transistors of a differential pair within the pixel 220 and a current mirror circuit within the circuit chip 202 to be described later to each other operates as a differential amplifier that amplifies a difference between an analog signal and a reference signal from the DAC 234.

The V-drivers 231 and 232 drive pixels 220 in readout target rows to make differential amplified signals output. For example, the V-driver 231 drives odd rows, and the V-driver 232 drives even rows. In addition, the H-driver 233 drives the pixels 220 in column units. Incidentally, the rows driven by the respective V-drivers 231 and 232 do not necessarily need to be divided into even rows and odd rows or the like. The V-drivers 231 and 232 can, for example, drive the same rows with an objective of quickening settling.

The DAC 234 generates an analog ramp signal changing in a slope manner as a reference signal by DA (Digital to Analog) conversion. The DAC 234 supplies the generated reference signal to all of pixels within the pixel region 210.

Figure 4:
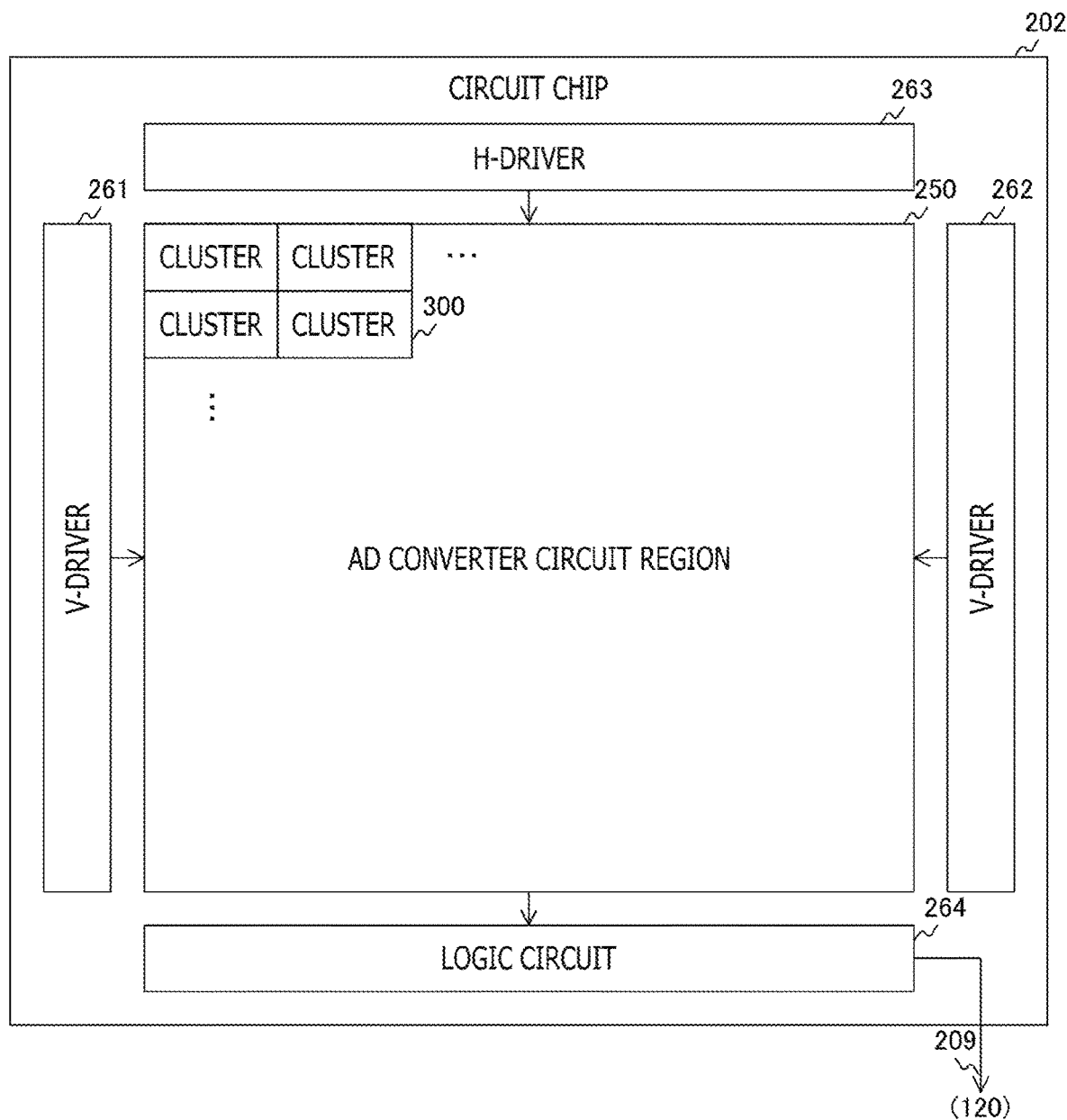
FIG. 4 is a block diagram illustrating one example of configuration of a circuit chip in the first embodiment of the present technology.

FIG. 4 is a block diagram illustrating one example of configuration of the circuit chip 202 in the first embodiment of the present technology. Arranged in the circuit chip 202 are an AD converter circuit region 250, V-drivers 261 and 262, an H-driver 263, and a logic circuit 264. A plurality of clusters 300 is arranged two-dimensionally in a lattice manner in the AD converter circuit region 250. A cluster 300 is provided for each of the pixel blocks 211. Supposing that the number of pixel blocks 211 is N (N is an integer), N clusters 300 are provided. The pixel blocks 211 and the clusters 300 are connected to each other on a one-to-one basis.

A cluster 300 converts an analog differential amplified signal from the corresponding pixel block 211 into a digital signal for each pixel and supplies the digital signal as pixel data to the logic circuit 264.

The V-drivers 261 and 262 make digital signals generated by driving circuits within the clusters 300. For example, the V-driver 261 drives circuits corresponding to odd rows, and the V-driver 262 drives circuits corresponding to even rows. Alternatively, the V-drivers 261 and 262 drive circuits in the same rows. In addition, the H-driver 263 makes the generated digital signals transferred as pixel data from the clusters 300 to the logic circuit 264.

The logic circuit 264 performs various kinds of signal processing such as CDS (Correlated Double Sampling) processing on the transferred pixel data for each pixel. The logic circuit 264 supplies image data including the pixel data after the processing to the DSP circuit 120.

[Example of Configuration of Cluster]

Figure 5:
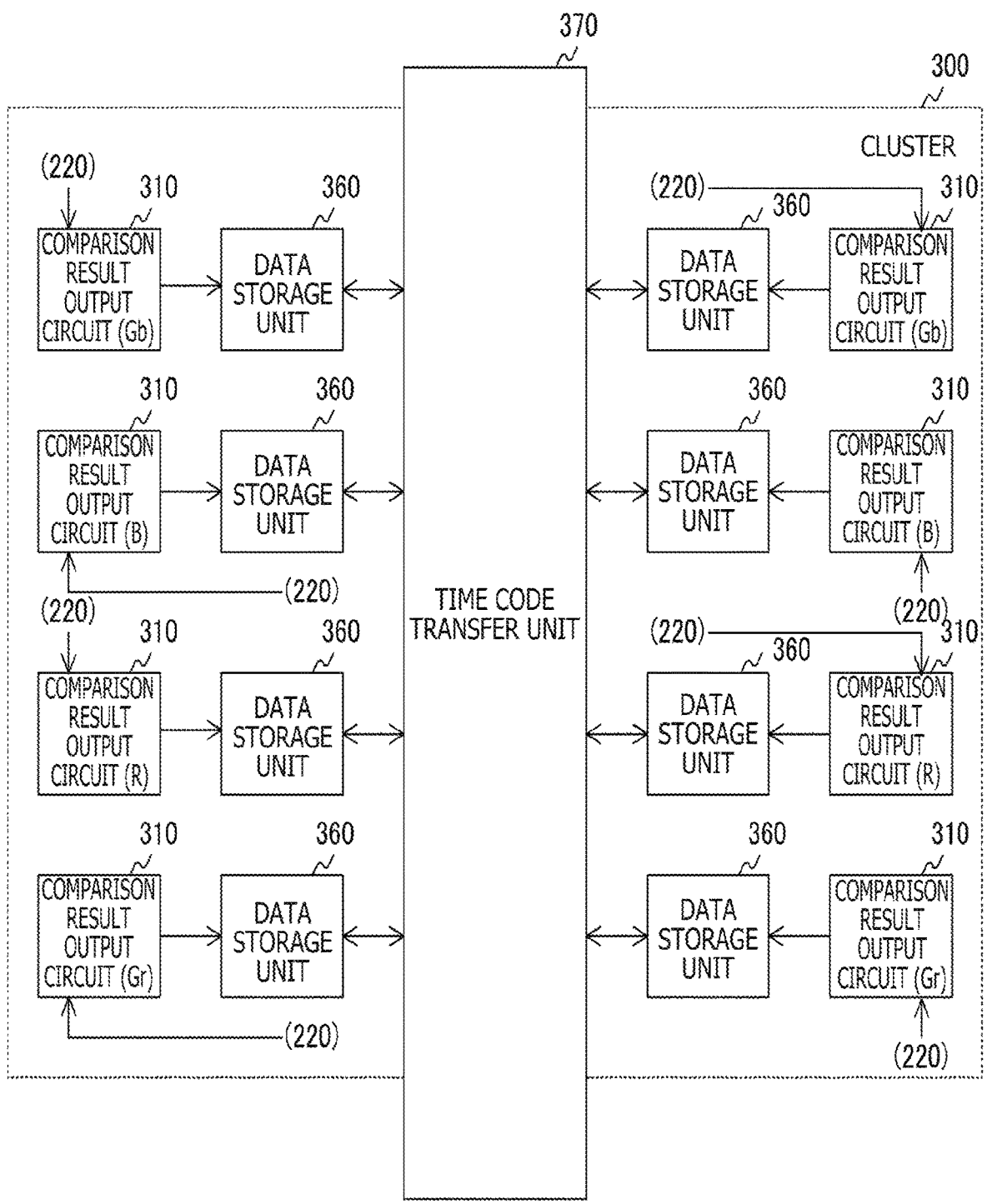
FIG. 5 is a block diagram illustrating one example of configuration of a cluster in the first embodiment of the present technology.

FIG. 5 is a block diagram illustrating one example of configuration of a cluster 300 in the first embodiment of the present technology. The cluster 300 has a comparison result output circuit 310 and a data storage unit 360 arranged therein for each pixel within the pixel block 211. In a case where the number of pixels within a pixel block 211 is eight, eight comparison result output circuits 310 and eight data storage units 360 are arranged. In addition, a time code transfer unit 370 is disposed for each column of clusters 300 in the AD converter circuit region 250. In a case where the number of columns of clusters 300 is M (M is an integer), M time code transfer units 370 are arranged. Supposing that the number of clusters 300 of a certain column is L (L is an integer), those L clusters 300 share one time code transfer unit 370 corresponding to the column.

In addition, the eight comparison result output circuits 310 are connected on a one-to-one basis to the eight respective pixels 220 within the pixel block 211 corresponding to the cluster 300. In a case where the pixels 220 are arranged in a Bayer array, for example, pixels of R (Red), Gb (Green), B (Blue), and Gr (Green) are arranged in two rows×two columns on a left side among two rows×four columns within the pixel block 211. In addition, R, Gb, B, and Gr pixels are also arranged similarly in two rows×two columns on a right side. In this arrangement, the R, Gb, B, and Gr pixels on the left side are connected to the four comparison result output circuits 310 on the left side, and the R, Gb, B, and Gr pixels on the right side are connected to the four comparison result output circuits 310 on the right side.

The time code transfer unit 370 transfers a time code from a counter (not illustrated) that generates a time code to the cluster 300, and transfers the time code from the cluster 300 to the logic circuit 264. This time code indicates a time within a period in which the reference signal changes in a slope manner.

The comparison result output circuits 310 subject differential amplified signals from the corresponding pixels 220 to voltage conversion and amplification processing. The comparison result output circuits 310 output signals after the processing as a result of comparison between analog signals and the reference signal to the data storage units 360.

A data storage unit 360 retains the time code as pixel data in timing in which a comparison result is inverted. Then, the data storage unit 360 outputs the retained time code (that is, the pixel data) to the logic circuit 264 via the time code transfer unit 370. Thus, an analog differential amplified signal is converted into digital pixel data.

Figure 6:
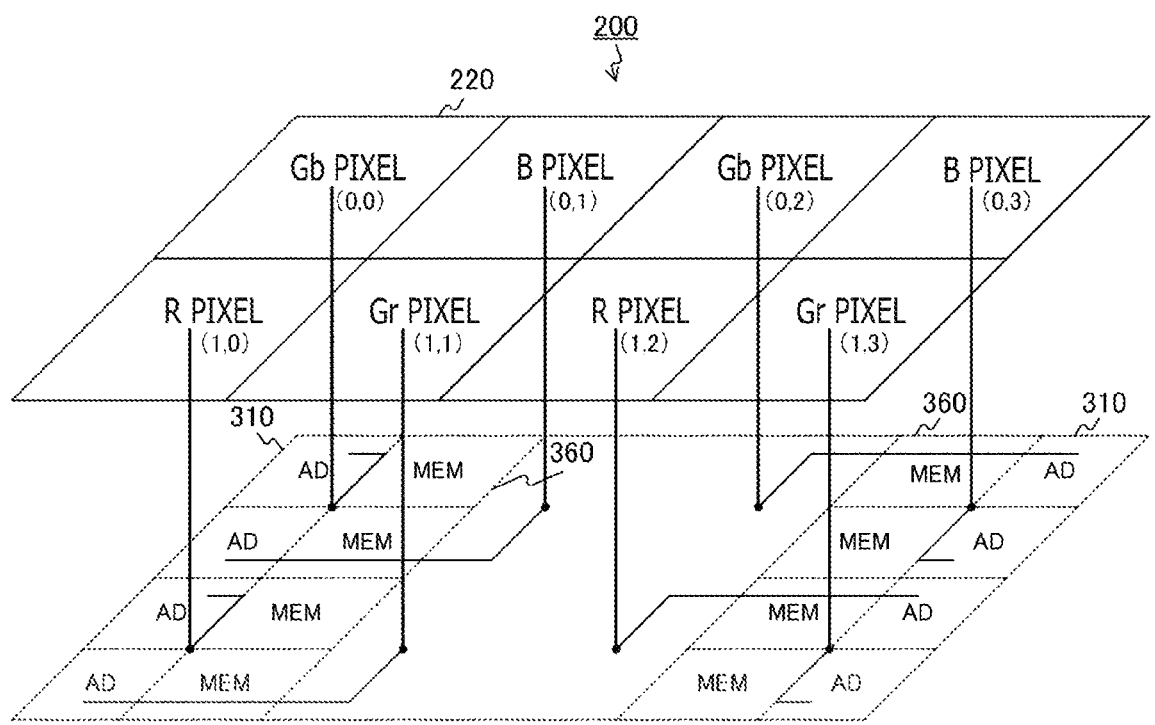
FIG. 6 is a perspective view illustrating an example of connection relation between pixels and circuits within the cluster in the first embodiment of the present technology.

FIG. 6 is a perspective view illustrating an example of connection relation between pixels 220 and circuits within a cluster 300 in the first embodiment of the present technology.

Suppose that coordinates of a pixel 220 in an mth (m is an integer) row and an nth (n is an integer) column within a pixel block 211 are (m, n). A Gb pixel, a B pixel, an R pixel, and a Gr pixel are arranged at coordinates (0, 0), (0, 1), (1, 0), and (1, 1) on the left side. In addition, a Gb pixel, a B pixel, an R pixel, and a Gr pixel are also arranged at coordinates (0, 2), (0, 3), (1, 2), and (1, 3) on the right side. Such an array is referred to as a Bayer array. Incidentally, the pixels can be arranged according to an array other than the Bayer array. For example, an R pixel, a G pixel, a B pixel, and a W (White) pixel can be arranged.

The R, Gb, B, and Gr pixels on the left side are connected to four comparison result output circuits 310 on the left side. The R, Gb, B, and Gr pixels on the right side are connected to four comparison result output circuits 310 on the right side. Incidentally, in the figure, "AD" denotes a comparison result output circuit 310, and "MEM" denotes a data storage unit 360.

[Example of Configuration of Pixel and Comparison Result Output Circuit]

Figure 7:
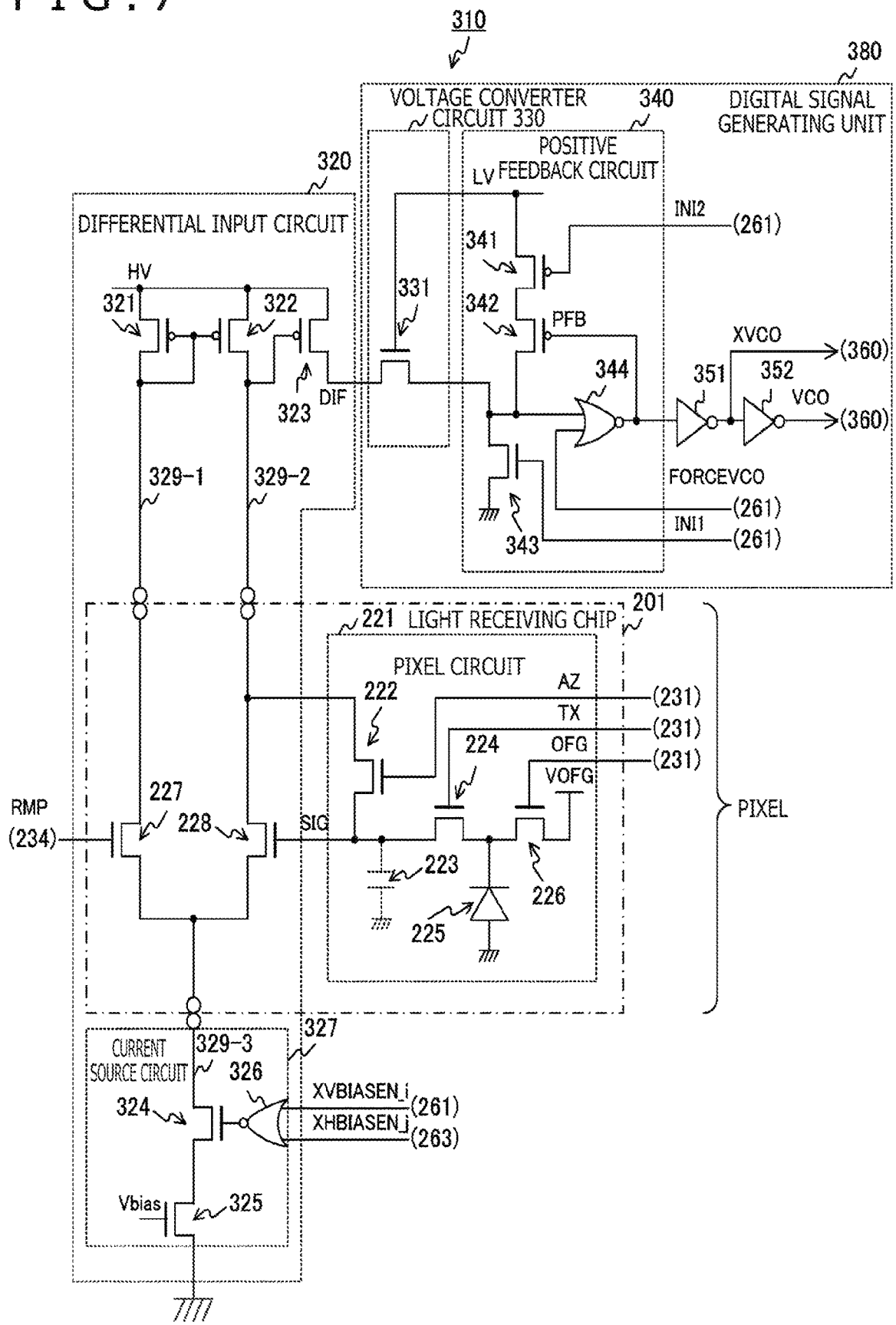
FIG. 7 is a circuit diagram illustrating one example of configuration of a pixel and a comparison result output circuit in the first embodiment of the present technology.

FIG. 7 is a circuit diagram illustrating one example of configuration of a pixel 220 and a comparison result output circuit 310 in the first embodiment of the present technology.

The pixel 220 is disposed in the light receiving chip 201. A pixel circuit 221 and differential transistors 227 and 228 are arranged within the pixel 220.

The pixel circuit 221 generates an analog signal by photoelectric conversion. The pixel circuit 221 includes, for example, a reset transistor 222, a floating diffusion layer 223, a transfer transistor 224, a photodiode 225, and a discharge transistor 226. An N-type MOS (Metal-Oxide-Semiconductor) transistor, for example, is used as the reset transistor 222, the transfer transistor 224, the photodiode 225, and the discharge transistor 226.

The photodiode 225 generates a charge by photoelectric conversion. When the discharge transistor 226 is given an instruction for a discharge by a driving signal OFG from a driver (the V-driver 231 or the like), the discharge transistor 226 discharges the charge from the photodiode 225.

When the transfer transistor 224 is given an instruction for a transfer by a transfer signal TX from the driver, the transfer transistor 224 transfers the charge from the photodiode 225 to the floating diffusion layer 223 at the time of an end of exposure.

The floating diffusion layer 223 accumulates the transferred charge and generates an analog signal SIG of a voltage corresponding to an amount of the accumulated charge.

The reset transistor 222 initializes the floating diffusion layer 223 when an instruction for initialization is given by a reset signal AZ from the driver.

The differential transistors 227 and 228 amplify a difference between the analog signal SIG and a reference signal RMP using a constant current and output the difference as a differential amplified signal DIF. An N-type MOS transistor, for example, is used as the differential transistors 227 and 228. Respective sources of the differential transistors 227 and 228 are connected, in common, to a circuit within the circuit chip 202 via a common node. In addition, a gate of the differential transistor 228 is connected to the floating diffusion layer 223. A gate of the differential transistor 227 is connected to the DAC 234.

In addition, P-type transistors 321, 322, and 323, an N-type transistor 324, a current source transistor 325, a NOR gate 326, and a digital signal generating unit 380 are arranged in the comparison result output circuit 310. A voltage converter circuit 330, a positive feedback circuit 340, inverters 351 and 352, and a data storage unit 360 are arranged in the digital signal generating unit 380. A MOS transistor, for example, is used as the P-type transistor 321, the P-type transistor 322, the P-type transistor 323, the N-type transistor 324, and the current source transistor 325.

The P-type transistors 321, 322, and 323 are connected in parallel to a terminal of a power supply voltage HV. In addition, a gate of the P-type transistor 321 is connected to a drain of the P-type transistor 321 itself and a gate of the P-type transistor 322. In addition, the drain of the P-type transistor 321 is connected to a drain of the differential transistor 227 via a signal line 329-1. A drain of the P-type transistor 322 is connected to a drain of the differential transistor 228 via a signal line 329-2. In addition, a gate of the P-type transistor 323 is connected to the drain of the P-type transistor 322. A drain of the P-type transistor 323 is connected to the voltage converter circuit 330.

A circuit including the P-type transistors 321, 322, and 323 functions as a current mirror circuit because of the above-described connection configuration. The differential amplified signal DIF is output from the current mirror circuit to the voltage converter circuit 330.

In addition, a drain of the N-type transistor 324 is connected to the common node of the differential transistors 227 and 228 via a signal line 329-3. A source of the N-type transistor 324 is connected to a drain of the current source transistor 325.

The NOR gate 326 outputs a non-conjunction of a row enable signal XVBIASEN_i and a column enable signal XHBIASEN_j to a gate of the N-type transistor 324. Here, the row enable signal XVBIASEN_i is an enable signal indicating whether or not to enable an ith (i is an integer) row. The row enable signal XVBIASEN_i is generated by a driver such as the V-driver 261. The column enable signal XHBIASEN_j is an enable signal indicating whether or not to enable a jth (j is an integer) row. The column enable signal XHBIASEN_j is generated by a driver such as the H-driver 263. In addition, when the drivers enable a row and a column, the drivers set "0" in the corresponding enable signals. When the drivers disable a row and a column, the drivers set "1" in the enable signals. In addition, the row enable signal XVBIASEN_i is input to the comparison result output circuits 310 connected to pixels in the ith row. The column enable signal XHBIASEN_j is input to the comparison result output circuits 310 connected to pixels in the jth row.

The NOR gate 326 controls the N-type transistor 324 to a closed state in a case where the row enable signal XVBIASEN_i and the column enable signal XHBIASEN_j both indicate enabling. The NOR gate 326 controls the N-type transistor 324 to an opened state in a case where either the row enable signal XVBIASEN_i or the column enable signal XHBIASEN_j indicates disabling. Incidentally, the NOR gate 326 is an example of a logic gate described in the claims.

A predetermined bias voltage Vbias is applied to a gate of the current source transistor 325. A source of the current source transistor 325 is grounded.

Because of the above-described connection configuration, the current source transistor 325 functions as a current source that supplies a constant current corresponding to the bias voltage Vbias. In addition, according to the enable signals, the N-type transistor 324 opens or closes a path between the common node of the differential transistors 227 and 228 and the current source transistor 325. Incidentally, the current source transistor 325 is an example of a current source described in the claims. In addition, the N-type transistor 324 is an example of a switching element described in the claims.

When readout is performed while some of all of the pixels are excluded, a driver such as the V-driver 261 sets a row or a column corresponding to the excluded pixels in a disabled state by a corresponding enable signal. A differential input circuit 320 of a pixel set in a disabled state is in a standby state in which the constant current does not flow. This can reduce power consumption of the differential input circuit 320 as compared with a configuration in which the constant current is allowed to flow irrespective of the enable signals. As a method for interrupting the constant current, a stop of supply of the power supply voltage HV is conceivable, but is not desirable because it takes time for the voltage to become stable after power is turned on again.

In addition, a circuit including the N-type transistor 324, the current source transistor 325, and the NOR gate 326 functions as a current source circuit 327 that supplies the constant current according to the enable signals.

The voltage converter circuit 330 converts the voltage of the differential amplified signal DIF from the differential input circuit 320. The voltage converter circuit 330 includes an N-type transistor 331. A MOS transistor, for example, is used as the N-type transistor 331. The N-type transistor 331 is inserted between the differential input circuit 320 and the positive feedback circuit 340. A power supply voltage LV lower than the power supply voltage HV is applied to a gate of the N-type transistor 331.

The positive feedback circuit 340 adds a part of an output to an input (differential amplified signal), and outputs the result as a positive feedback signal PFB. The positive feedback circuit 340 includes P-type transistors 341 and 342, an N-type transistor 343, and a NOR gate 344. A MOS transistor, for example, is used as the P-type transistor 341, the P-type transistor 342, and the N-type transistor 343.

The P-type transistor 341, the P-type transistor 342, and the N-type transistor 343 are connected in series between a terminal of the power supply voltage LV and a grounding terminal. A driving signal INI2 from a driver such as the V-driver 261 is input to a gate of the P-type transistor 341. A driving signal INI1 from a driver such as the V-driver 261 is input to the N-type transistor 343.

One of two input terminals of the NOR gate 344 is connected to connection terminals of the P-type transistor 342 and the N-type transistor 343. The other of the two input terminals of the NOR gate 344 is supplied with a driving signal FORCEVCO from a driver such as the V-driver 261. The NOR gate 344 outputs a non-conjunction of input signals as the positive feedback signal PFB to a gate of the P-type transistor 342 and an inverter 351.

The inverter 351 inverts the positive feedback signal PFB, and outputs the inverted positive feedback signal PFB as a comparison result XVCO to an inverter 352 and the data storage unit 360. The inverter 352 inverts the comparison result XVCO, and outputs the inverted comparison result XVCO as a comparison result VCO to the data storage unit 360.

A circuit including the voltage converter circuit 330, the positive feedback circuit 340, and the data storage unit 360 described above functions as the digital signal generating unit 380 that generates a digital signal from the differential amplified signal DIF.

Incidentally, the N-type transistor 324 and the current source transistor 325 can be arranged in the light receiving chip 201, as will be described later. However, a circuit scale of the light receiving chip 201 can be reduced by arranging the N-type transistor 324 and the current source transistor 325 in the circuit chip 202, as illustrated in the figure.

Figure 8:
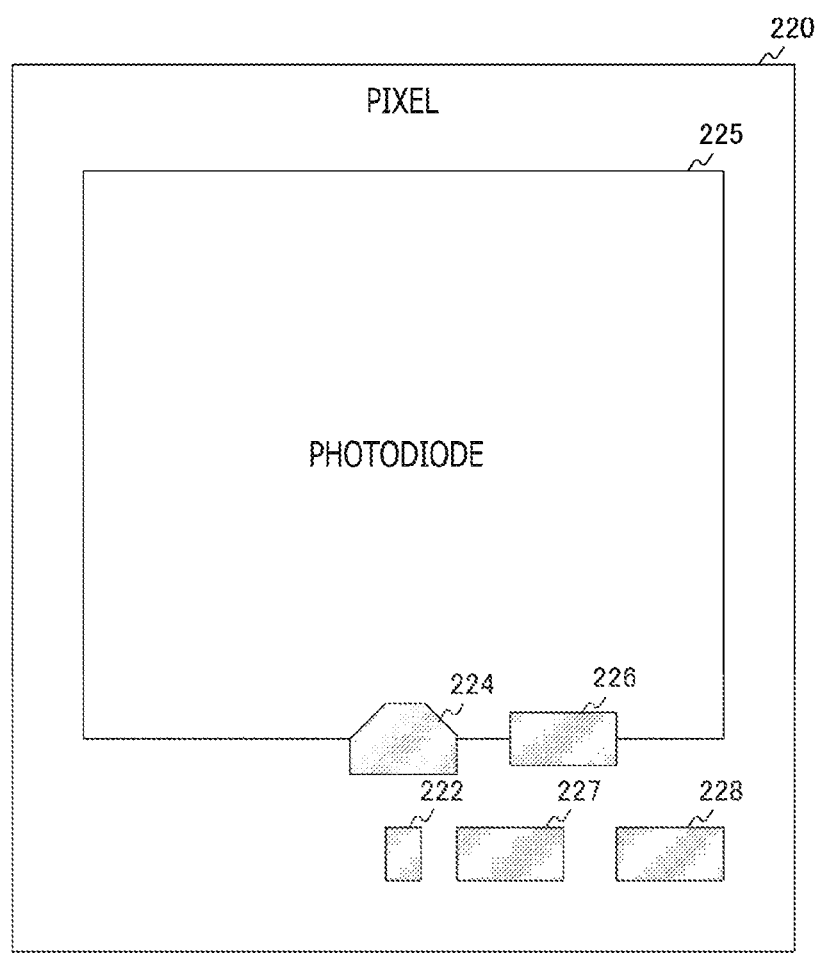
FIG. 8 is a plan view illustrating a layout of elements within the pixel in the first embodiment of the present technology.

FIG. 8 is a plan view illustrating a layout of elements within the pixel 220 in the first embodiment of the present technology. The figure is an example of a plan view of the pixel 220 as viewed from a predetermined direction perpendicular to an optical axis.

The reset transistor 222, the transfer transistor 224, the photodiode 225, the discharge transistor 226, and the differential transistors 227 and 228 are arranged in the pixel 220. The transfer transistor 224 and the discharge transistor 226 are arranged on one side of the photodiode 225. The reset transistor 222 and the differential transistors 227 and 228 are arranged in a vicinity of the transfer transistor 224 and the discharge transistor 226.

As illustrated in FIG. 7, the N-type transistor 324 and the current source transistor 325 are arranged in the circuit chip 202. The N-type transistor 324 and the current source transistor 325 therefore do not need to be arranged in the pixel 220 within the light receiving chip 201. Consequently, as illustrated in FIG. 8, the number of transistors in the pixel 220 can be reduced.

Figure 9:
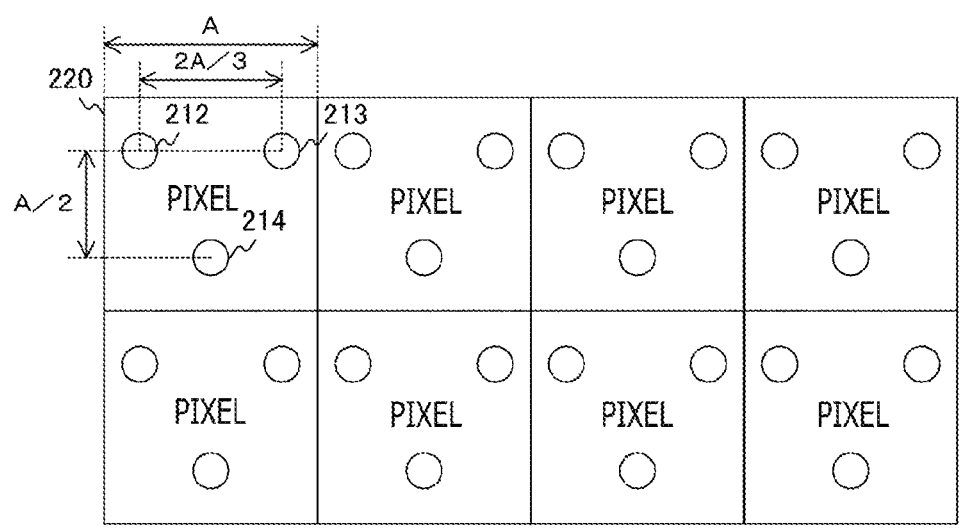
FIG. 9 is a diagram illustrating an example of arrangement of terminals within pixels in the first embodiment of the present technology.

FIG. 9 is a diagram illustrating an example of arrangement of terminals within pixels in the first embodiment of the present technology. As illustrated in FIG. 7, the pixel 220 is electrically connected to the circuit chip 202 via the signal lines 329-1, 329-2, and 329-3 by Cu—Cu connection or the like. Therefore, terminals 212, 213, and 214 corresponding to these signal lines are arranged in each pixel. Suppose that a shape of the pixel 220 is a square shape, and suppose that a length of one side of the square shape is A. In this case, the terminals 212 and 213 are arranged such that an interval between centers of the terminals 212 and 213 is 2A/3. In addition, the terminals 212, 213, and 214 are arranged such that an interval between the respective centers of the terminals 212 and 213 and a center of the terminal 214 is A/2.

Figure 10:
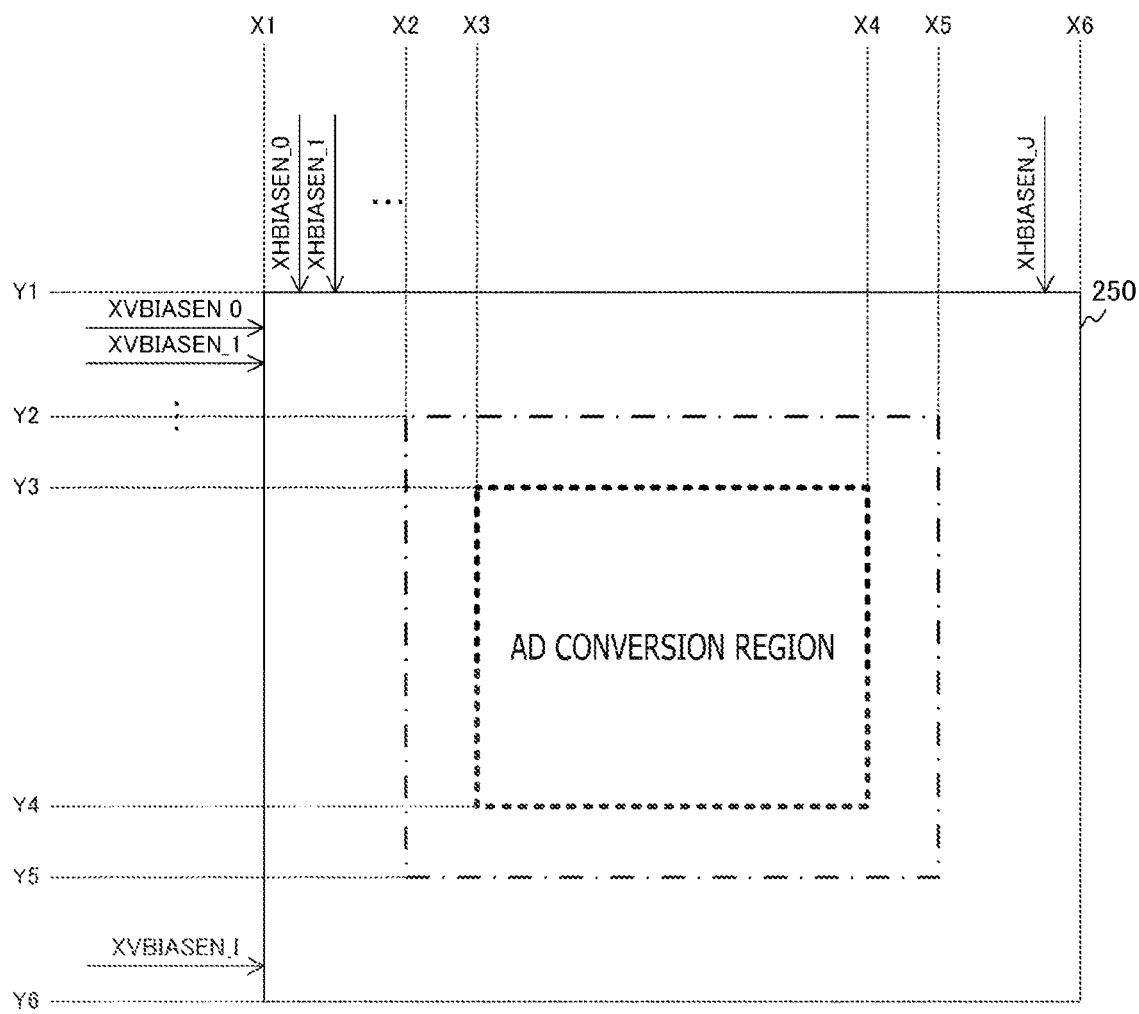
FIG. 10 is a diagram of assistance in explaining a method of using enable signals in the first embodiment of the present technology.

FIG. 10 is a diagram of assistance in explaining a method of using the enable signals in the first embodiment of the present technology. The solid-state imaging element 200 can perform crop processing that reads out a partial region of the pixel region 210. In addition, the solid-state imaging element 200 can also perform thinning-out processing that thins out pixels in row or column units. The former crop processing is used when an angle of view is narrowed. The latter thinning-out processing is used to reduce the number of pixels within the image data. In the crop processing and the thinning-out processing, drivers such as the V-driver 231 within the solid-state imaging element 200 drive only pixels to be read, and do not drive the remaining pixels. In addition, in the crop processing and the thinning-out processing, the drivers enable rows and columns corresponding to the pixels to be read by the enable signals, and disable the rest.

For example, suppose that a left end of the AD converter circuit region 250 is X1, that a right end of the AD converter circuit region 250 is X6, that an upper end of the AD converter circuit region 250 is Y1, and that a lower end of the AD converter circuit region 250 is Y6. In a case where the drivers enable all rows from Y1 to Y6 by the row enable signal XVBIASEN_i, and enable all columns from X1 to X6 by the column enable signal XHBIASEN_j, image data of a full angle of view is read.

In addition, suppose that a left end of a region enclosed by alternate long and short dashed lines is X2, that a right end of the region is X5, that an upper end of the region is Y2, and that a lower end of the region is Y5. Consideration will be given to a case where the drivers enable rows from Y2 to Y5 and columns from X2 to X5 by the row enable signal XVBIASEN_i and the column enable signal XHBIASEN_j, and disable the remaining rows and columns. In this case, image data of an angle of view of super 35 millimeters (mm) is read by the crop processing, for example.

In addition, suppose that a left end of a region enclosed by a thick dotted line is X3, that a right end of the region is X4, that an upper end of the region is Y3, and that a lower end of the region is Y4. Consideration will be given to a case where the drivers enable rows from Y3 to Y4 and columns from X3 to X4 by the row enable signal XVBIASEN_i and the column enable signal XHBIASEN_j, and disable the remaining rows and columns. In this case, image data of an angle of view of 4K is read by the crop processing, for example. Incidentally, the angle of view for readout by the crop processing is not limited to the angles of view of super 35 millimeters or 4K, but can be set in a desired manner.

In addition, in the case of excluding rows and columns, the drivers set the rows and columns to be excluded in a disabled state by the enable signals. For example, in the case of excluding odd rows and odd columns and reading even rows and even columns, the drivers set the even rows and the even columns in an enabled state by the enable signals, and disable the rest. It is thereby possible to reduce the number of pixels (in other words, resolution) of the image data. A reduction in the number of pixels improves image data readout speed, and decreases power consumption at the time of imaging of the solid-state imaging element 200.

[Example of Operation of Solid-State Imaging Element]

Figure 11:
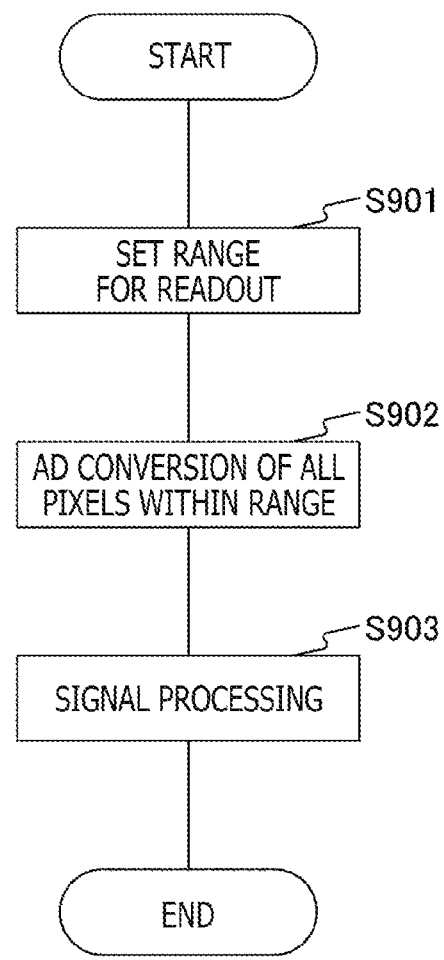
FIG. 11 is a flowchart illustrating an example of operation of the solid-state imaging element in the first embodiment of the present technology.

FIG. 11 is a flowchart illustrating an example of operation of the solid-state imaging element 200 in the first embodiment of the present technology. This operation is, for example, started when a predetermined application for imaging image data is executed.

The solid-state imaging element 200 sets a range for readout by the crop processing by the enable signals (step S901). Then, the solid-state imaging element 200 subjects analog signals of all pixels within the range to AD conversion (step S902), and performs signal processing such as CDS processing (step S903). After step S903, the solid-state imaging element 200 ends the operation for imaging. When a plurality of pieces of image data is to be imaged consecutively, steps S901 to S903 are repeatedly performed in synchronism with a vertical synchronizing signal.

Thus, in the first embodiment of the present technology, the current source circuit 327 supplies or interrupts the constant current to the differential transistors 227 and 228 according to the enable signals. It is thereby possible to reduce power consumption of the differential input circuit 320 as compared with a case of supplying the constant current at all times irrespective of the enable signals.

[First Modification]

In the foregoing first embodiment, three transistors are arranged in each pixel circuit 221. However, a circuit scale of the pixel region 210 is increased as the number of pixels is increased. A pixel circuit 221 according to a first modification of the present first embodiment is different from that of the first embodiment in that the number of transistors in the pixel circuit 221 is reduced.

Figure 12:
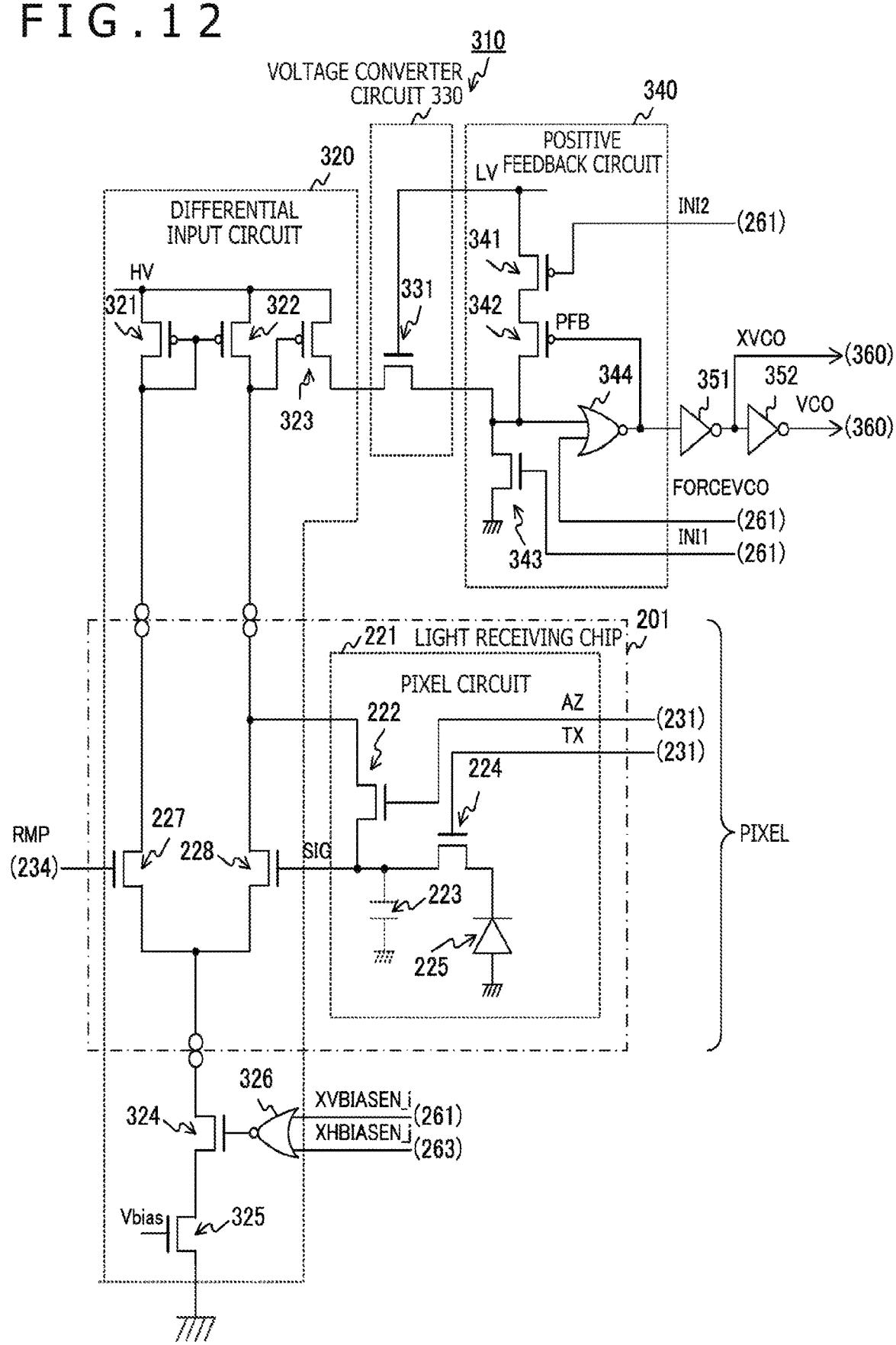
FIG. 12 is a circuit diagram illustrating one example of configuration of a pixel circuit in a first modification of the first embodiment of the present technology.

FIG. 12 is a circuit diagram illustrating one example of configuration of the pixel circuit 221 in the first modification of the first embodiment of the present technology. The pixel circuit 221 according to the first modification of the present first embodiment is different from that of the first embodiment in that the discharge transistor 226 is not provided.

In the first modification of the first embodiment, a driver such as the V-driver 231 simultaneously transmits the reset signal AZ and the transfer signal TX when a charge is discharged from the photodiode 225.

Thus, in the first modification of the first embodiment of the present technology, the discharge transistor 226 is removed from the pixel circuit 221. It is therefore possible to reduce the circuit scale of the pixel region 210 as compared with the first embodiment provided with the discharge transistor 226.

[Second Modification]

In the foregoing first embodiment, three transistors are arranged in each pixel circuit 221. However, the circuit scale of the pixel region 210 is increased as the number of pixels is increased. A pixel region 210 according to a second modification of the present first embodiment is different from that of the first embodiment in that a plurality of pixels 220 shares the floating diffusion layer 223.

Figure 13:
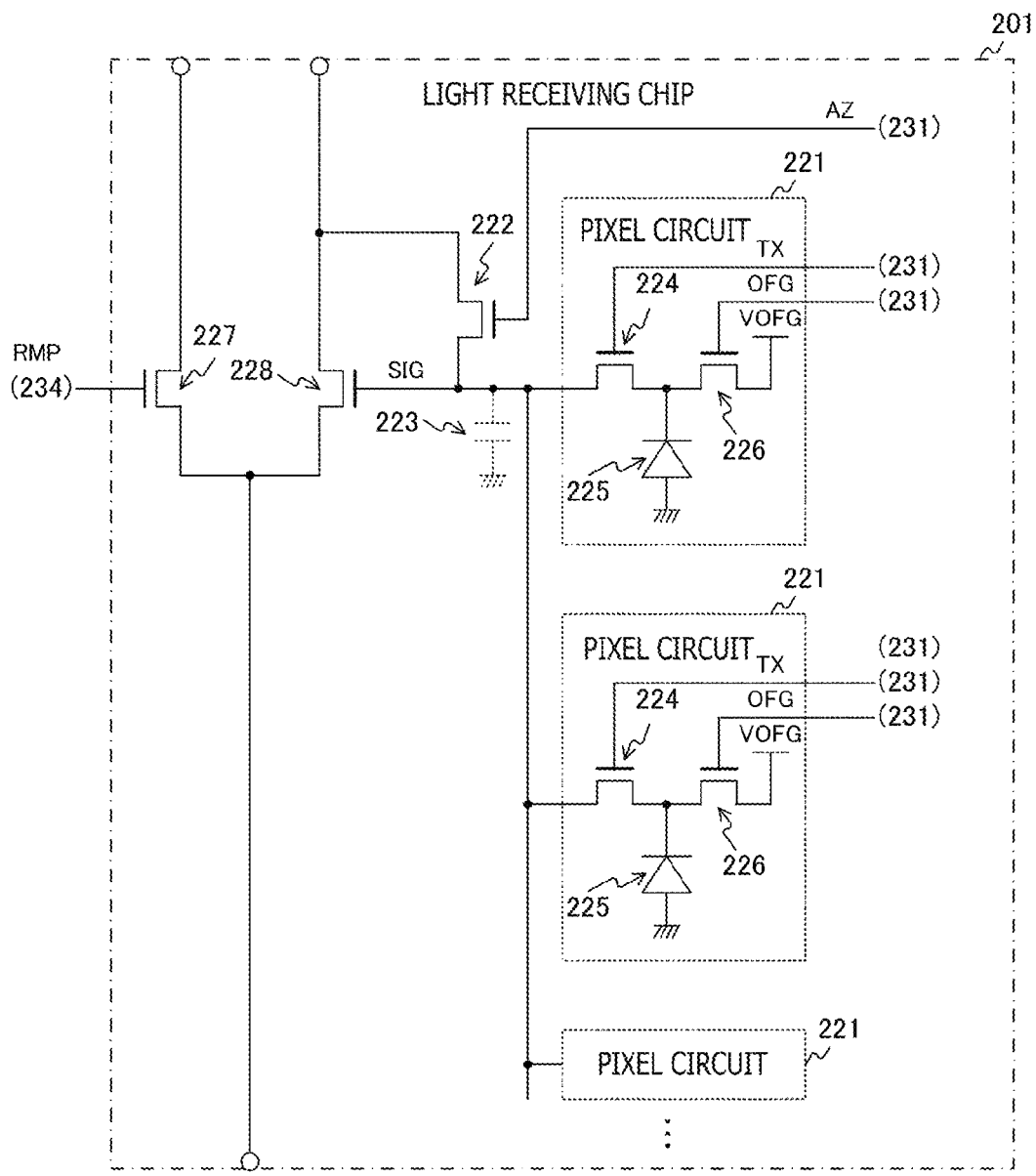
FIG. 13 is a circuit diagram illustrating one example of configuration of a pixel circuit in a second modification of the first embodiment of the present technology.

FIG. 13 is a circuit diagram illustrating one example of configuration of a pixel block 211 in the second modification of the first embodiment of the present technology. The pixel block 211 according to the second modification of the present first embodiment is different from that of the first embodiment in that a plurality of pixel circuits 221 (eight pixel circuits 221, for example) shares the floating diffusion layer 223. The transfer transistor 224, the photodiode 225, and the discharge transistor 226 are arranged in each of the pixel circuits 221. The transfer transistor 224 of each of the plurality of pixel circuits 221 transfers a charge to the shared floating diffusion layer 223 in order. In addition, the differential transistor 227, the differential transistor 228, and the reset transistor 222 are also shared by the plurality of pixel circuits 221. One pixel circuit 221, the differential transistors 227 and 228, the reset transistor 222, and the floating diffusion layer 223 constitute one pixel 220.

Incidentally, the first modification can be applied to the solid-state imaging element 200 according to the second modification.

Thus, according to the second modification of the first embodiment of the present technology, the plurality of pixel circuits 221 shares the floating diffusion layer 223, and therefore a circuit scale of the pixel circuit 221 can be reduced as compared with the first embodiment in which the floating diffusion layer 223 is not shared.

[Third Modification]

The foregoing first embodiment performs readout while the pixel data of some of all pixels are excluded. However, the thinning-out processing reduces the number of pixels in image data, and may degrade image quality. A solid-state imaging element 200 according to a third modification of the present first embodiment is different from that of the first embodiment in that a degradation in image quality is suppressed by averaging analog signals.

Figure 14:
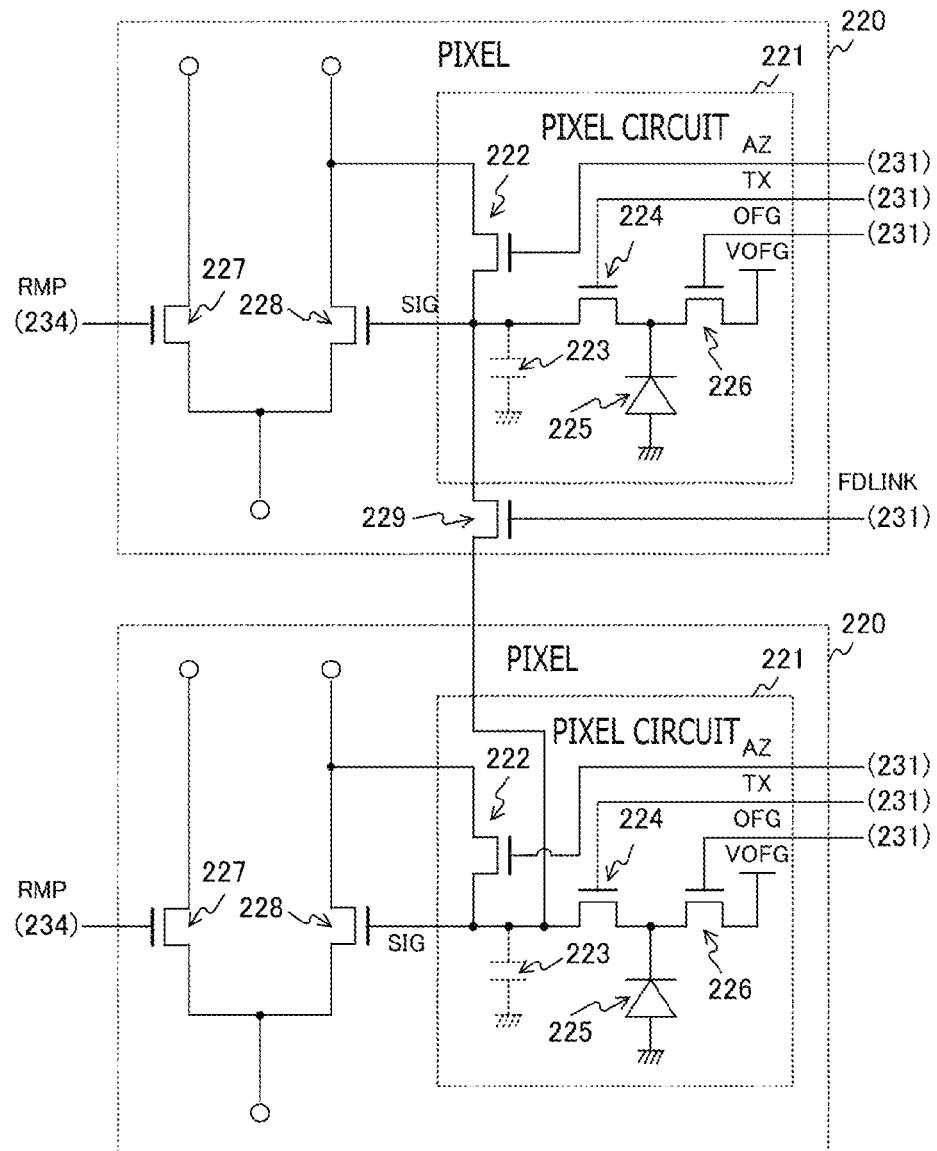
FIG. 14 is a circuit diagram illustrating one example of configuration of a pixel in a third modification of the first embodiment of the present technology.

FIG. 14 is a circuit diagram illustrating one example of configuration of a pixel 220 in the third modification of the first embodiment of the present technology. The pixel 220 according to the third modification of the present first embodiment is different from that of the first embodiment in that a connecting transistor 229 is further disposed in one of a pair of pixels 220 adjacent to each other. An N-type MOS transistor, for example, is used as the connecting transistor 229.

The connecting transistor 229 connects the respective floating diffusion layers 223 of the pair of adjacent pixels 220 to each other according to a driving signal FDLINK from a driver. The driving signal FDLINK is, for example, supplied at the time of the thinning-out processing. The connection of the floating diffusion layers 223 to each other averages analog signals generated by the respective floating diffusion layers 223 of the pair of pixels 220. The averaging can reduce noise, and thus suppress a degradation in image quality due to the thinning-out processing.

Incidentally, whereas the analog signals of the pair of pixels 220 are averaged, the respective floating diffusion layers 223 of three or more pixels 220 adjacent to each other may be connected to one another to perform the averaging. In addition, the first or second modification can be applied to the solid-state imaging element 200 according to the third modification.

Thus, according to the third modification of the first embodiment of the present technology, the connecting transistor 229 connects the respective floating diffusion layers 223 of the pair of adjacent pixels 220 to each other, so that the respective analog signals of those pixels 220 can be averaged. It is thereby possible to suppress a degradation in image quality due to the thinning-out processing.

[Fourth Modification]

In the foregoing first embodiment, the drivers supply the enable signals in row and column units. However, the larger the number of rows and the number of columns become, the more the signal lines for transmitting the enable signals are increased. A solid-state imaging element 200 according to a fourth modification of the present first embodiment is different from that of the first embodiment in that the enable signals are supplied in block units of a plurality of pixels (for example, four pixels adjacent to each other).

Figure 15:
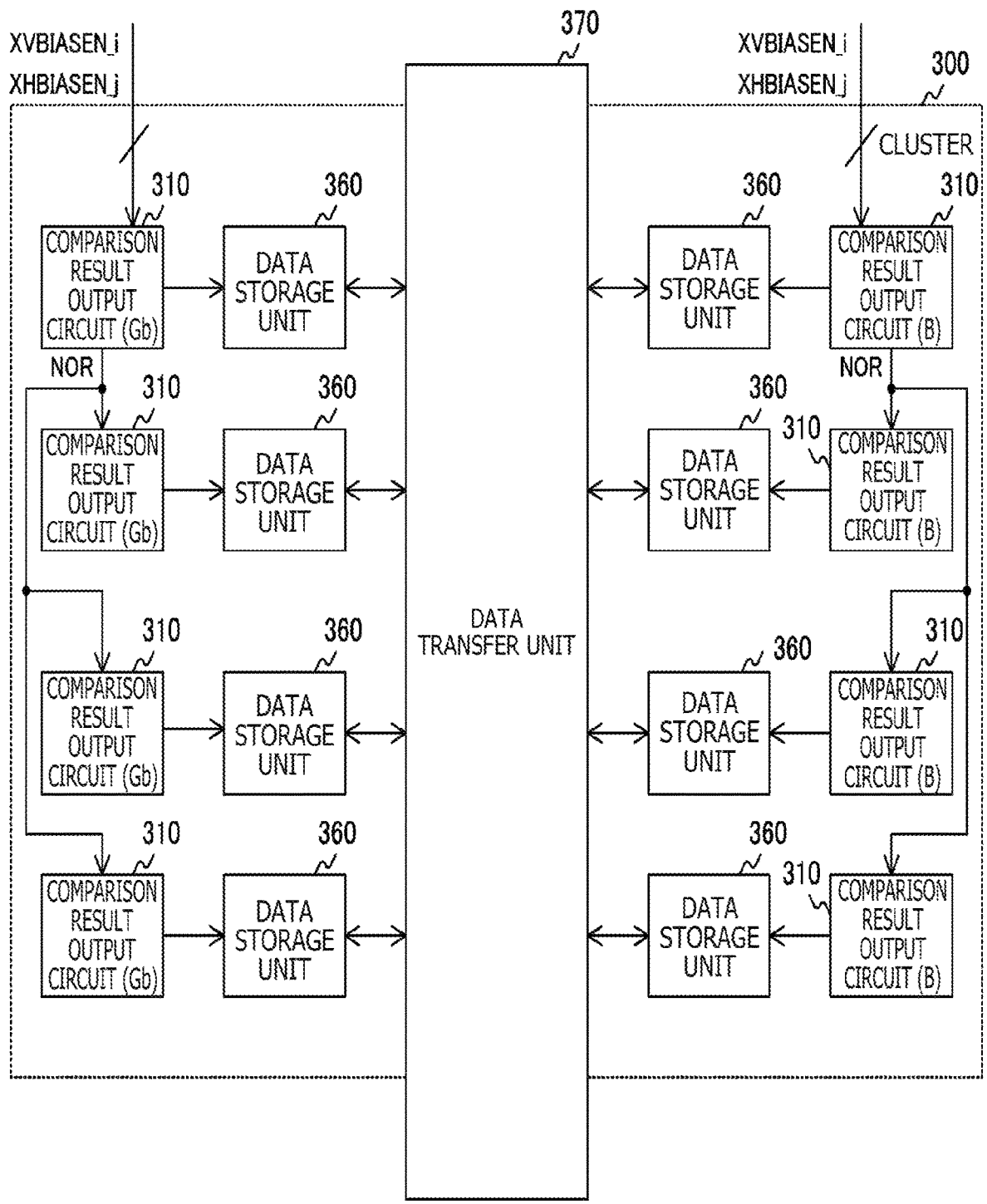
FIG. 15 is a block diagram illustrating one example of configuration of a cluster in a fourth modification of the first embodiment of the present technology.

FIG. 15 is a block diagram illustrating one example of configuration of a cluster 300 in the fourth modification of the first embodiment of the present technology. The cluster 300 according to the fourth modification of the present first embodiment is different from that of the first embodiment in that the enable signals are supplied to every four pixels adjacent to each other.

Pixels 220 according to the fourth modification of the first embodiment are, for example, arranged such that four pixels adjacent to each other are of a same color. For example, four pixels of two rows×two columns on the left side of the cluster 300 are all either R pixels, Gb pixels, B pixels, or Gr pixels (Gb pixels or the like), and four pixels of two rows×two columns on the right side are pixels of a same color different from that on the left side (B pixels or the like). A pixel block including four pixels of a same color will hereinafter be referred to as a "same color pixel block."

The drivers supply the row enable signal XVBIASEN_i and the column enable signal XHBIASEN_j to a comparison result output circuit 310 corresponding to any of the four pixels on the left side. In addition, the drivers supply the row enable signal XVBIASEN_i and the column enable signal XHBIASEN_j to a comparison result output circuit 310 corresponding to any of the four pixels on the right side within the pixel block 211. Here, the row enable signal XVBIASEN_i is generated for each row of same color pixel blocks, and the column enable signal XHBIASEN_j is generated for each column of same color pixel blocks.

A NOR (non-conjunction) gate 326 is disposed in a circuit supplied with the enable signals among the four comparison result output circuits 310 on the left side, and the NOR gate 326 is not disposed in the three other circuits. Then, the four comparison result output circuits 310 on the left side share the one NOR gate 326. A non-conjunction signal NOR from the comparison result output circuit 310 in which the NOR gate 326 is disposed is input to each of the comparison result output circuits 310 in which the NOR gate 326 is not disposed. This similarly applies to the four comparison result output circuits 310 on the right side. Incidentally, while the four pixels adjacent to each other share the NOR gate 326, there is no limitation to this configuration. For example, a plurality of pixels not adjacent to each other but in the vicinity of each other can share the NOR gate 326. Specifically, in the Bayer array, R pixels are arranged in every other pixel along a horizontal direction and a vertical direction with a G pixel interposed therebetween, and four R pixels in the vicinity of each other in the array or the like share the NOR gate 326.

Figure 16:
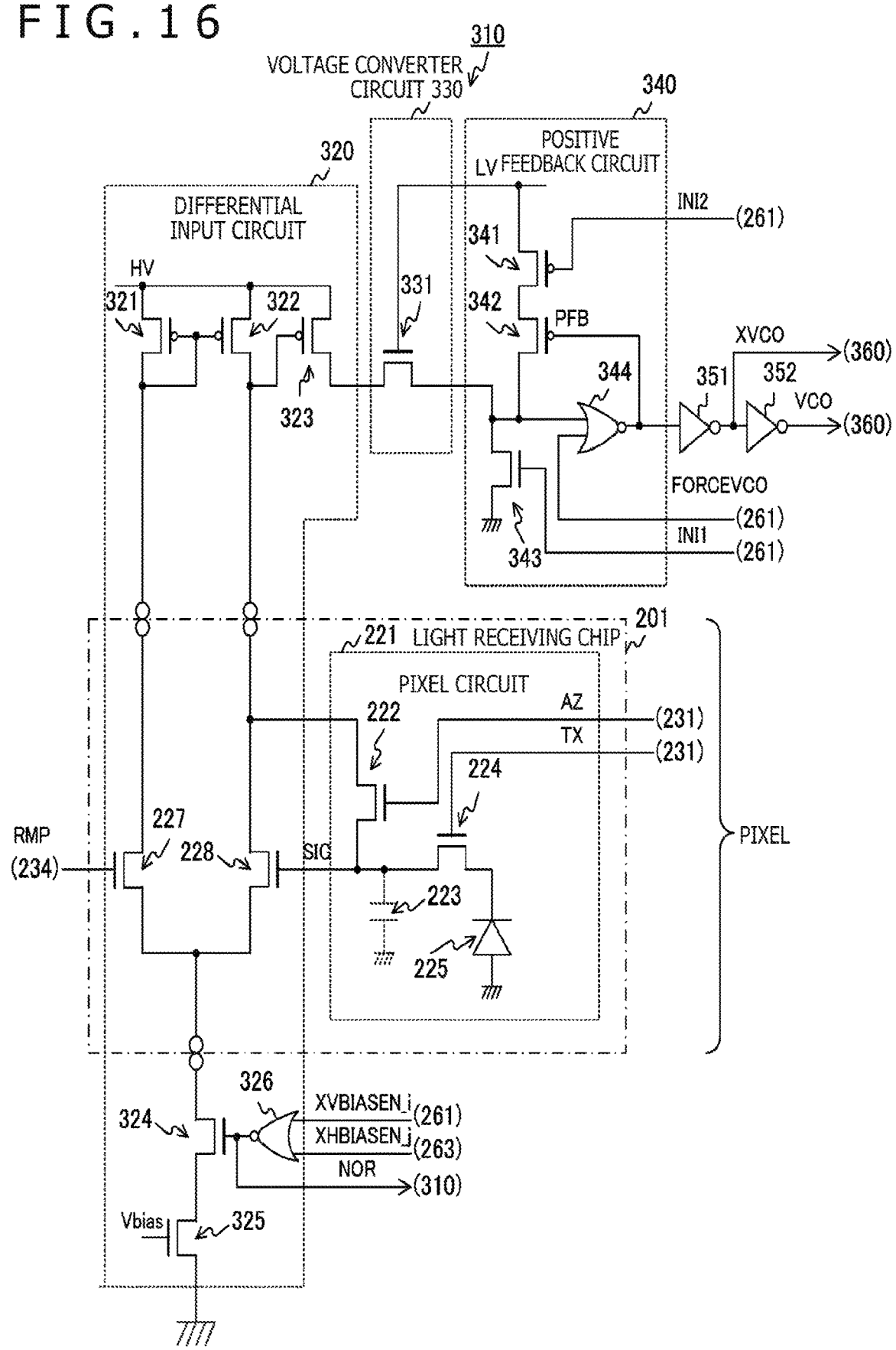
FIG. 16 is a circuit diagram illustrating one example of configuration of a comparison result output circuit in which a NOR (non-conjunction) gate is disposed in the fourth modification of the first embodiment of the present technology.

FIG. 16 is a circuit diagram illustrating one example of configuration of the comparison result output circuit 310 in which the NOR gate 326 is disposed in the fourth modification of the first embodiment of the present technology. The NOR gate 326 according to the fourth modification of the present first embodiment generates the non-conjunction signal NOR, and supplies the non-conjunction signal NOR to the N-type transistor 324 and the three adjacent comparison result output circuits 310.

Figure 17:
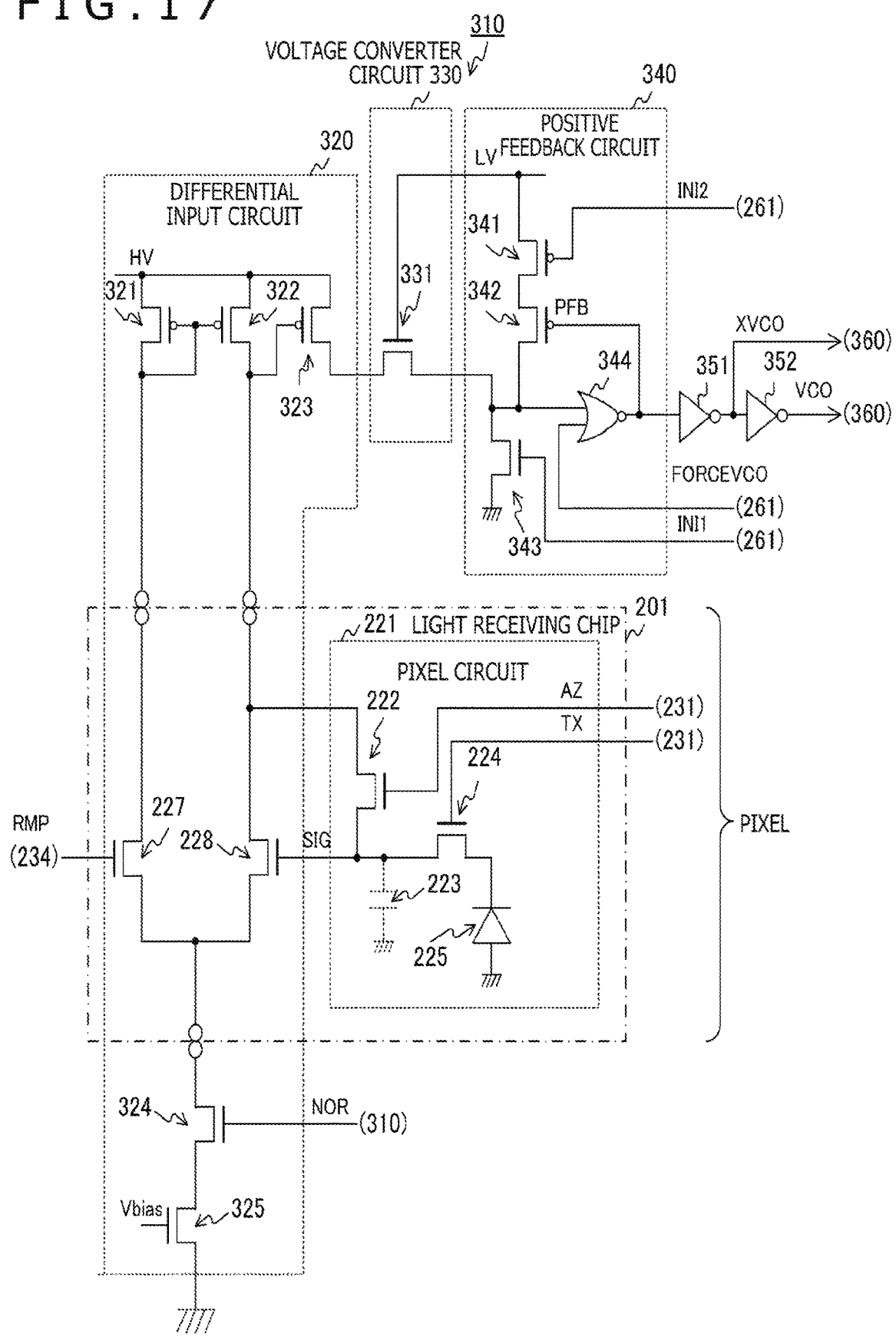
FIG. 17 is a circuit diagram illustrating one example of configuration of a comparison result output circuit in which the NOR (non-conjunction) gate is not disposed in the fourth modification of the first embodiment of the present technology.

FIG. 17 is a circuit diagram illustrating one example of configuration of a comparison result output circuit 310 in which the NOR gate 326 is not disposed in the fourth modification of the first embodiment of the present technology. The gate of the N-type transistor 324 according to the fourth modification of the present first embodiment is supplied with the non-conjunction signal NOR from the adjacent comparison result output circuit 310.

By the configuration illustrated in FIGS. 15 to 17, for each same color pixel block, the solid-state imaging element 200 can set the four pixels within the block in an enabled state or a disabled state. It is thereby possible to reduce the number of signal lines for transmitting the enable signals as compared with the first embodiment.

In addition, each of the first to third modifications can be applied to the solid-state imaging element 200 according to the fourth modification.

Thus, according to the fourth modification of the first embodiment of the present technology, the solid-state imaging element 200 can set each same color pixel block in an enabled state or a disabled state by the enable signals. It is thereby possible to reduce the number of signal lines for transmitting the enable signals as compared with the first embodiment that enables or disables each pixel by the enable signals.

[Fifth Modification]

In the foregoing first embodiment, the differential input circuits 320 corresponding to pixels set in an enabled state are not controlled to a standby state, and a constant current flows through the differential input circuits 320. However, this configuration may increase power consumption as a period for performing imaging is lengthened. A solid-state imaging element 200 according to a fifth modification of the present first embodiment is different from that of the first embodiment in that power consumption is further reduced by controlling the differential input circuit 320 in a standby state after an end of AD conversion.

Figure 18:
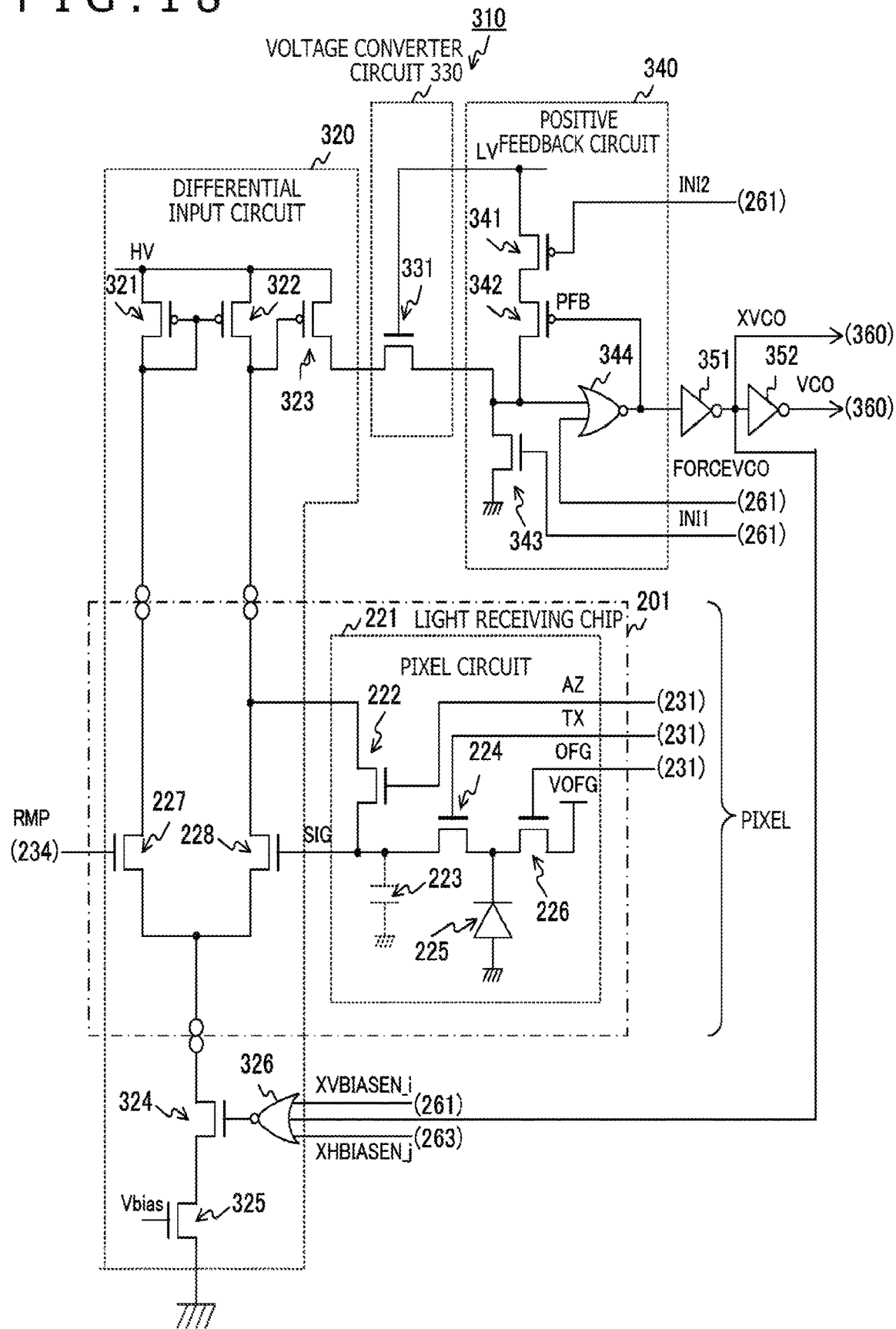
FIG. 18 is a circuit diagram illustrating one example of configuration of a comparison result output circuit in a fifth modification of the first embodiment of the present technology.

FIG. 18 is a circuit diagram illustrating one example of configuration of a comparison result output circuit 310 in the fifth modification of the first embodiment of the present technology. In the comparison result output circuit 310 according to the fifth modification of the present first embodiment, the inverter 351 further supplies the comparison result XVCO to the NOR gate 326. In addition, the NOR gate 326 outputs a non-conjunction of the row enable signal XVBIASEN_i, the column enable signal XHBIASEN_j, and the comparison result XVCO to the gate of the N-type transistor 324.

AD conversion is ended in timing in which the comparison result XVCO is inverted from a high level to a low level after an end of light exposure. Therefore, even in an enabled pixel not in a standby state, the constant current is interrupted in timing in which the comparison result XVCO is inverted (that is, a digital signal is generated), and the differential input circuit 320 makes a transition to a standby state. It is thereby possible to further reduce power consumption.

Incidentally, each of the first to fourth modifications can be applied to the solid-state imaging element 200 according to the fifth modification.

Thus, according to the fifth modification of the first embodiment of the present technology, the NOR gate 326 interrupts the constant current in timing in which a digital signal is generated. It is therefore possible to reduce power consumption as compared with the case where the constant current is supplied also after the generation of the digital signal.

[Sixth Modification]

In the foregoing first embodiment, the N-type transistor 324 and the current source transistor 325 are both arranged in the circuit chip 202. However, this configuration may increase a circuit scale of the circuit chip 202 as the number of pixels is increased. A solid-state imaging element 200 according to a sixth modification of the present first embodiment is different from that of the first embodiment in that the N-type transistor 324 and the current source transistor 325 are arranged in the light receiving chip 201.

Figure 19:
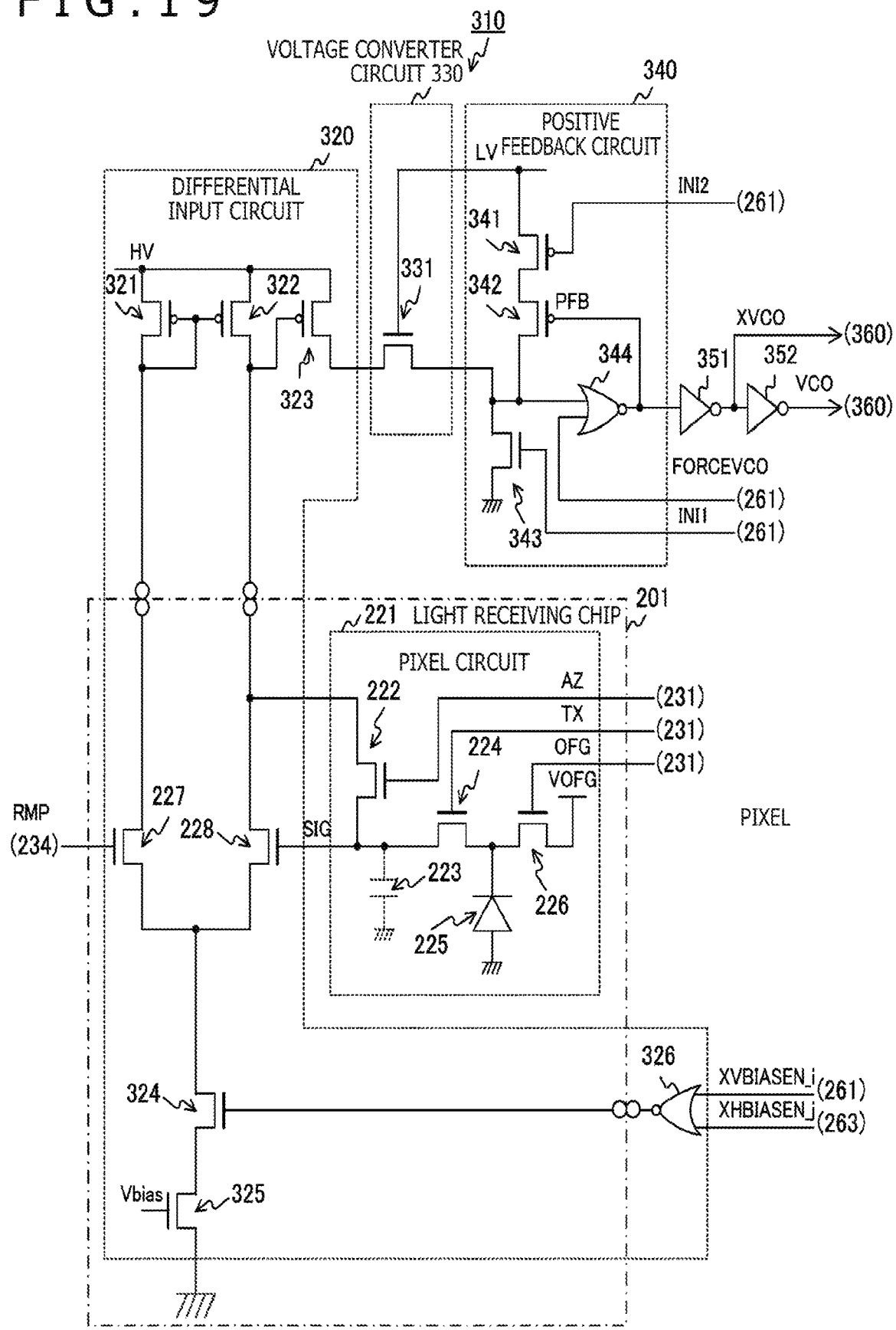
FIG. 19 is a circuit diagram illustrating one example of configuration of a pixel and a comparison result output circuit in a sixth modification of the first embodiment of the present technology.

FIG. 19 is a circuit diagram illustrating one example of configuration of a pixel 220 and a comparison result output circuit 310 in the sixth modification of the first embodiment of the present technology. The N-type transistor 324 and the current source transistor 325 according to the fifth modification of the present first embodiment are different from those of the first embodiment in that the N-type transistor 324 and the current source transistor 325 according to the fifth modification of the present first embodiment are arranged in the light receiving chip 201.

Incidentally, each of the first to fifth modifications can be applied to the solid-state imaging element 200 according to the sixth modification.

Thus, in the sixth modification of the first embodiment of the present technology, the N-type transistor 324 and the current source transistor 325 are arranged in the light receiving chip 201. It is thereby possible to reduce the circuit scale of the circuit chip 202 as compared with the case where those transistors are arranged in the circuit chip 202.

Second Embodiment

In the foregoing first embodiment, the solid-state imaging element 200 has the N-type transistor 324 inserted between the current source transistor 325 and the common node of the differential transistors 227 and 228. However, in this configuration, a voltage of the common node may vary due to an on resistance of the N-type transistor 324. In addition, an amplitude of the signal from the NOR gate 326 may be transmitted to the common node. A differential input circuit 320 according to the present second embodiment is different from that of the first embodiment in that the differential input circuit 320 according to the present second embodiment supplies or interrupts the bias voltage to the current source transistor 325.

Figure 20:
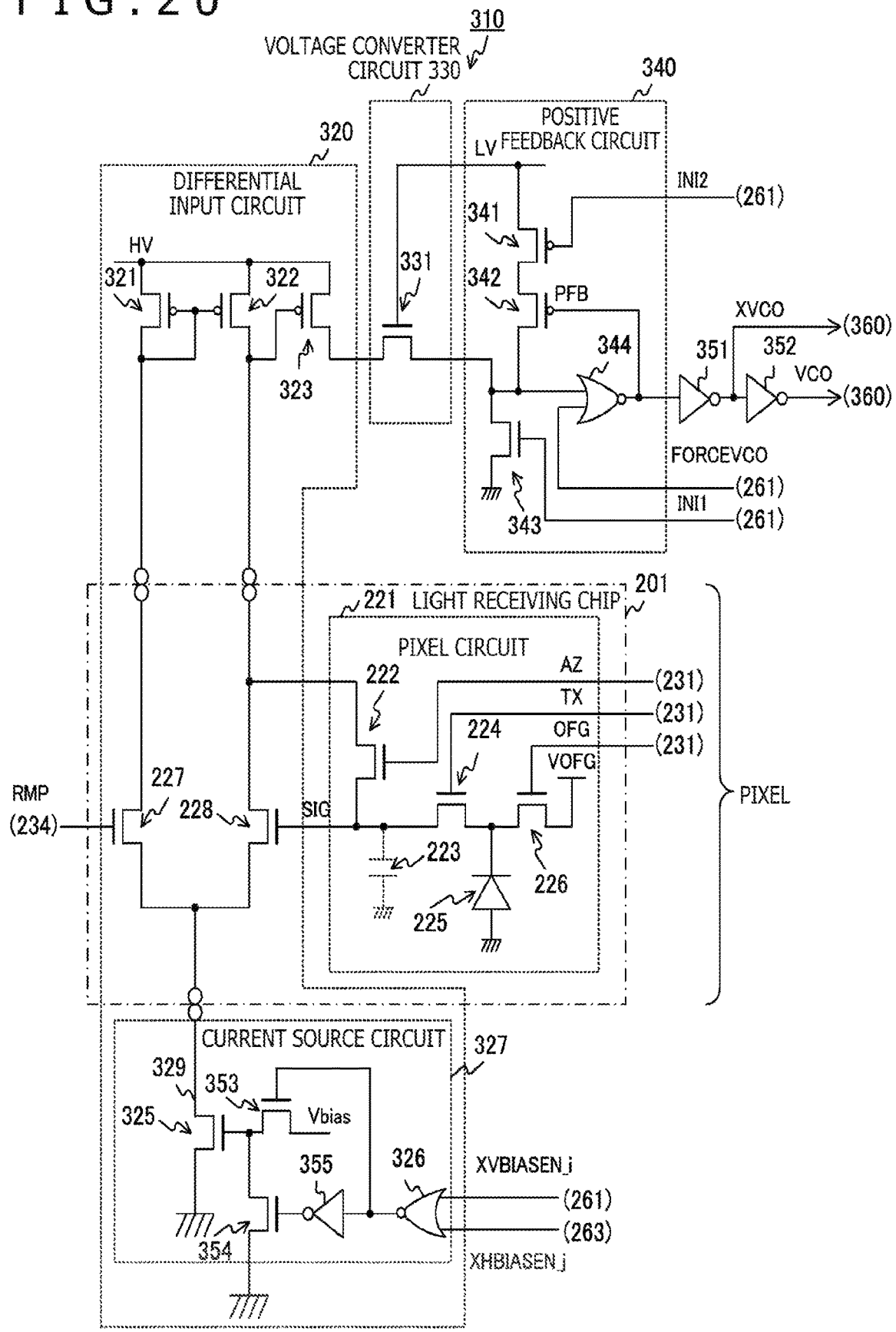
FIG. 20 is a circuit diagram illustrating one example of configuration of a comparison result output circuit in a second embodiment of the present technology.

FIG. 20 is a circuit diagram illustrating one example of configuration of a comparison result output circuit 310 in the second embodiment of the present technology. The second comparison result output circuit 310 is different from that of the first embodiment in that the second comparison result output circuit 310 includes N-type transistors 353 and 354 and an inverter 355 in place of the N-type transistor 324.

In addition, in the second embodiment, the current source transistor 325 is inserted between the common node of the differential transistors 227 and 228 and the grounding terminal. The N-type transistor 353 is inserted between a terminal of the bias voltage Vbias and the gate of the current source transistor 325. The NOR gate 326 outputs a non-conjunction of the enable signals to a gate of the N-type transistor 353 and the inverter 355. The N-type transistor 354 is inserted between the gate of the current source transistor 325 and the grounding terminal. The inverter 355 inverts the signal output from the NOR gate 326, and supplies the signal to a gate of the N-type transistor 354.

By the above-described connection configuration, a circuit including the N-type transistors 353 and 354 and the inverter 355 supplies or interrupts the bias voltage Vbias to the gate of the current source transistor 325 according to the enable signals. Incidentally, the circuit including the N-type transistors 353 and 354 and the inverter 355 is an example of a bias voltage supply circuit described in the claims. Because the N-type transistor 324 is not disposed between the current source transistor 325 and the common node of the differential transistors 227 and 228, the voltage of the common node does not vary due to the on resistance of the N-type transistor 324. In addition, transmission of the amplitude of the signal from the NOR gate 326 to the common node is suppressed.

Incidentally, each of the first to fifth modifications can be applied to the solid-state imaging element 200 according to the second embodiment.

Thus, in the second embodiment of the present technology, the current source circuit 327 supplies or interrupts the bias voltage Vbias to the gate of the current source transistor 325 according to the enable signals. It is thereby possible to remove the N-type transistor 324 between the current source transistor 325 and the common node of the differential transistors 227 and 228. The removal of the N-type transistor 324 eliminates variations in the voltage of the common node due to the on resistance of the N-type transistor 324, and suppresses transmission of the amplitude of the signal from the NOR gate 326 to the common node.

[Modification]

In the foregoing second embodiment, the N-type transistor 324 and the current source transistor 325 are both arranged in the circuit chip 202. However, this configuration may increase the circuit scale of the circuit chip 202 as the number of pixels is increased. A solid-state imaging element 200 according to a modification of the present second embodiment is different from that of the second embodiment in that the N-type transistor 324 and the current source transistor 325 are arranged in the light receiving chip 201.

Figure 21:
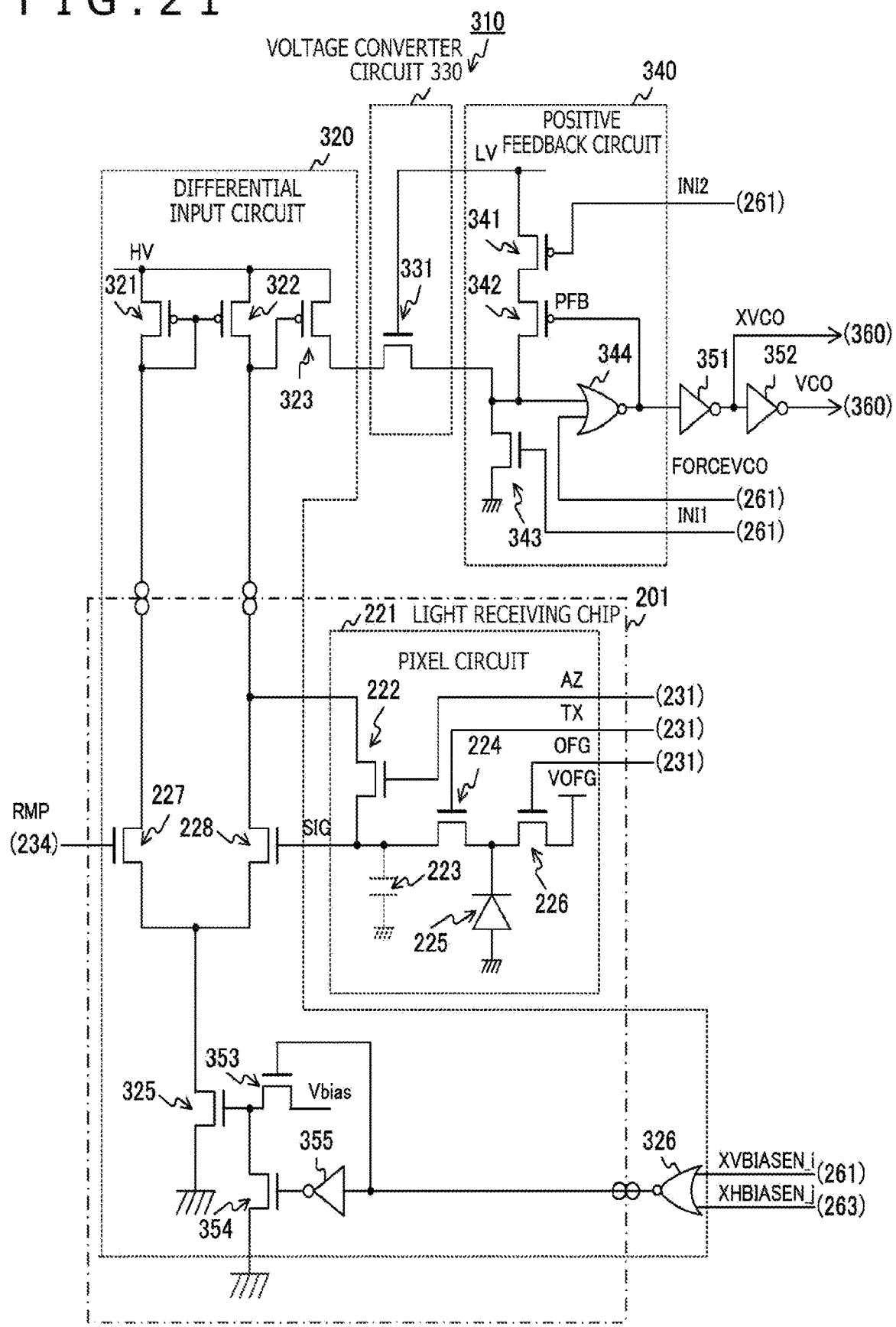
FIG. 21 is a circuit diagram illustrating one example of configuration of a pixel and a comparison result output circuit in a modification of the second embodiment of the present technology.

FIG. 21 is a circuit diagram illustrating one example of configuration of a pixel 220 and a comparison result output circuit 310 in the modification of the second embodiment of the present technology. The N-type transistor 324 and the current source transistor 325 according to the modification of the present second embodiment are different from those of the second embodiment in that the N-type transistor 324 and the current source transistor 325 according to the modification of the present second embodiment are arranged in the light receiving chip 201.

Thus, in the modification of the second embodiment of the present technology, the N-type transistor 324 and the current source transistor 325 are arranged in the light receiving chip 201. It is thereby possible to reduce the circuit scale of the circuit chip 202 as compared with the case where those transistors are arranged in the circuit chip 202.

<3. Example of Application to Mobile Body>

The technology according to the present disclosure (present technology) can be applied to various products. For example, the technology according to the present disclosure may be implemented as a device mounted on any kind of mobile body such as an automobile, an electric vehicle, a hybrid electric vehicle, a motorcycle, a bicycle, a personal mobility vehicle, an airplane, a drone, a ship, or a robot.

Figure 22:
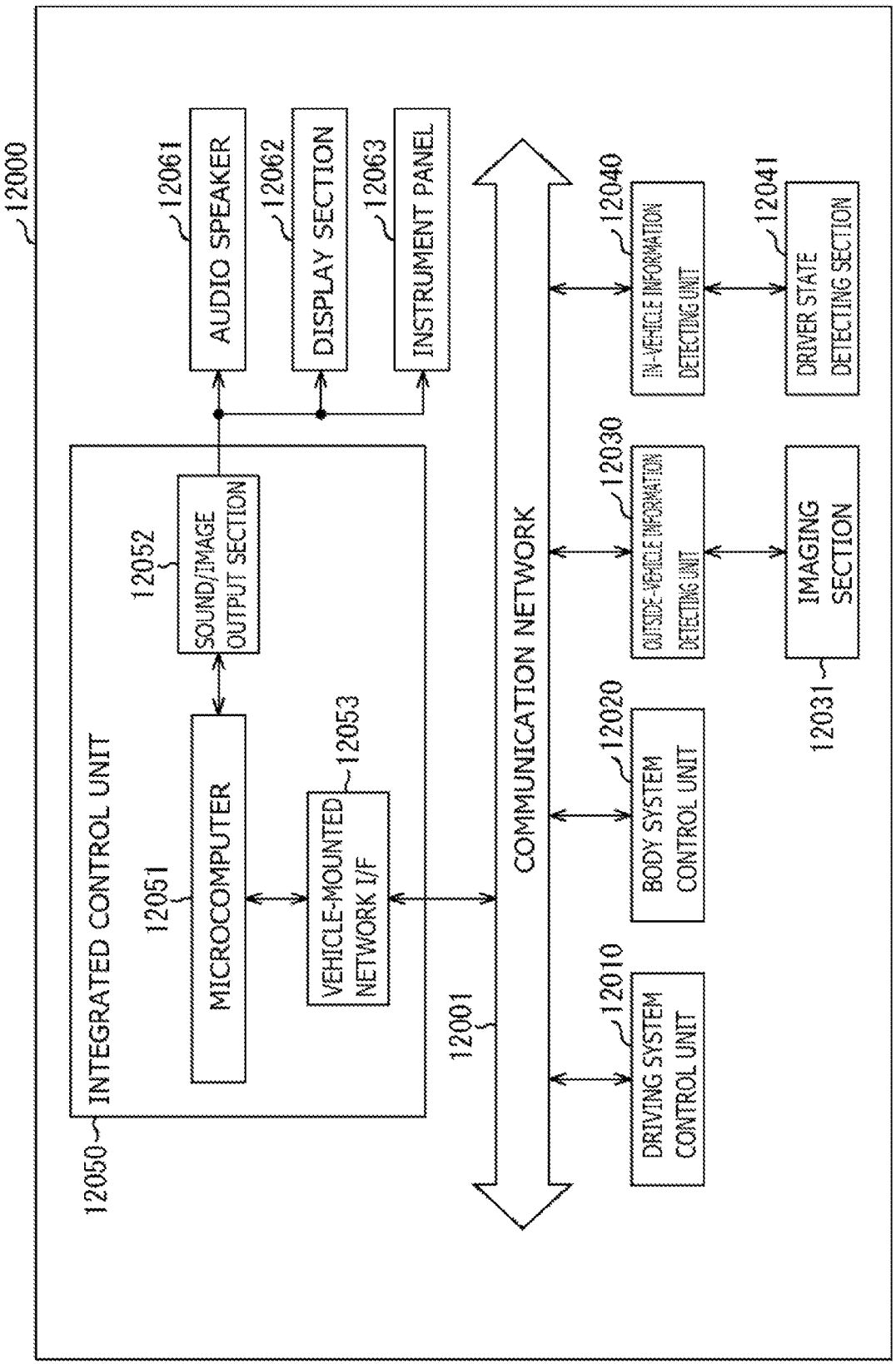
FIG. 22 is a block diagram depicting an example of schematic configuration of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
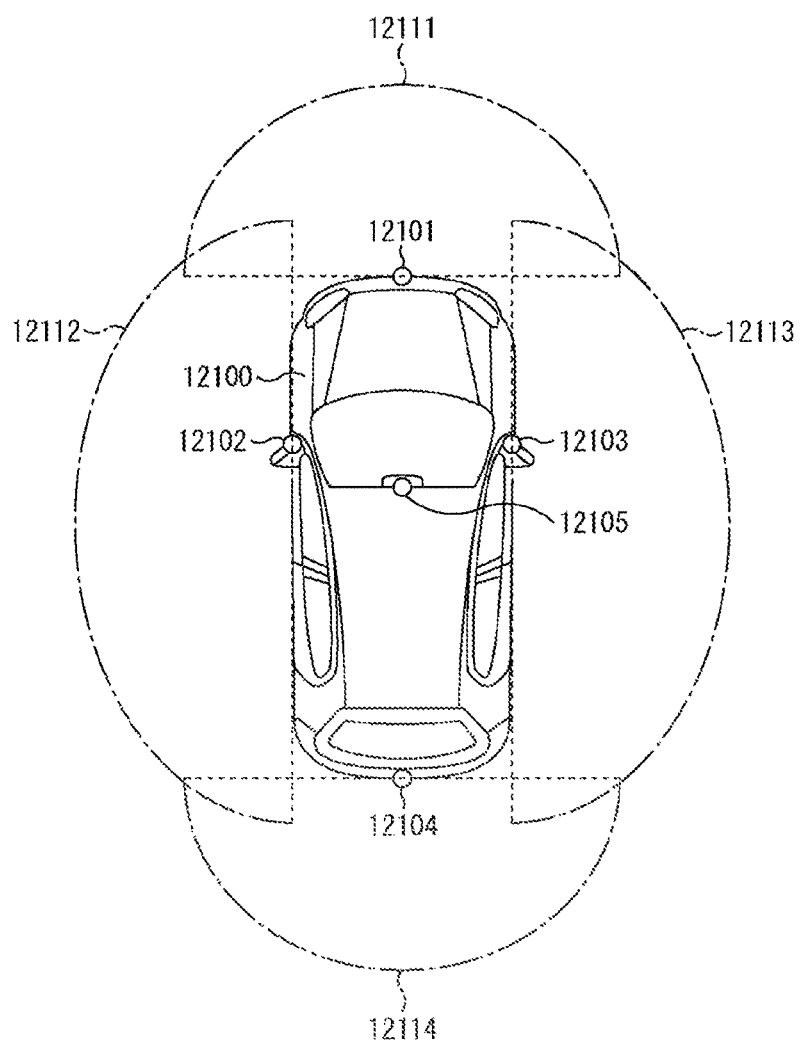
FIG. 23 is a diagram of assistance in explaining an example of installation positions of an outside-vehicle information detecting section and an imaging section.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described above. The technology according to the present disclosure can be applied to, for example, the imaging section 12031 in the configuration described above. Specifically, the imaging device 100 of FIG. 1 can be applied to the imaging section 12031. Power consumption of the imaging section 12031 can be further reduced by applying the technology according to the present disclosure to the imaging section 12031.

Incidentally, the foregoing embodiments represent an example for embodying the present technology, and matters in the embodiments have respective correspondence relations to inventive specific matters in the claims. Similarly, the inventive specific matters in the claims have respective correspondence relations to matters in the embodiments of the present technology which matters are given names identical to those of the inventive specific matters in the claims. However, the present technology is not limited to the embodiments, but can be embodied by making various modifications to the embodiments without departing from the spirit of the present technology.

It is to be noted that the effects described in the present specification are merely illustrative and are not limited, and that there may be other effects.

Incidentally, the present technology can also adopt the following configurations.

(1) A solid-state imaging element including:

a current source circuit configured to supply a predetermined constant current according to a predetermined enable signal;

a pair of differential transistors configured to generate a differential amplified signal using the constant current, the differential amplified signal being obtained by amplifying a difference between an analog signal generated by a pixel circuit and a predetermined reference signal; and a digital signal generating unit configured to generate a digital signal from the differential amplified signal.

(2) The solid-state imaging element according to the above (1), in which the current source circuit includes a current source configured to supply the constant current, and a switching element configured to open and close a path between the current source and a common node connected in common to the pair of differential transistors according to the enable signal.

(3) The solid-state imaging element according to the above (2), in which the pixel circuit is disposed in a predetermined light receiving chip, and the current source circuit is disposed in a predetermined circuit chip.

(4) The solid-state imaging element according to the above (2), in which the pixel circuit and a part of the current source circuit are disposed in a predetermined light receiving chip, and a rest of the current source circuit is disposed in a predetermined circuit chip.

(5) The solid-state imaging element according to the above (1), in which the current source circuit includes a current source configured to supply a current corresponding to a predetermined bias voltage as the constant current, and a bias voltage supply circuit configured to supply the bias voltage to the current source according to the enable signal.

(6) The solid-state imaging element according to the above (5), in which the pixel circuit is disposed in a predetermined light receiving chip, and the current source circuit is disposed in a predetermined circuit chip.

(7) The solid-state imaging element according to the above (5), in which the pixel circuit and a part of the current source circuit are disposed in a predetermined light receiving chip, and a rest of the current source circuit is disposed in a predetermined circuit chip.

(8) The solid-state imaging element according to any of the above (1) to (7), in which the pixel circuit includes a photoelectric conversion element configured to generate a charge by photoelectric conversion, a floating diffusion layer configured to accumulate the charge and generate a signal of a voltage corresponding to an amount of the charge as the analog signal, and a transfer transistor configured to transfer the charge from the photoelectric conversion element to the floating diffusion layer when given an instruction for transfer.

(9) The solid-state imaging element according to the above (8), in which the pixel circuit further includes a discharge transistor configured to discharge the charge from the photoelectric conversion element when given an instruction for discharge.

(10) The solid-state imaging element according to the above (8) or (9), further including:

a pixel region in which a plurality of pixels each including the pixel circuit is arranged two-dimensionally in a lattice manner, in which one of a pair of pixels adjacent to each other within the pixel region further includes a connecting transistor configured to connect the respective floating diffusion layers of the pair of pixels to each other.

(11) The solid-state imaging element according to the above (1), further including:

a pixel region in which a pixel block including a plurality of pixels each including the pixel circuit is arranged, in which the plurality of pixels shares a floating diffusion layer, and the pixel circuit includes a photoelectric conversion element configured to generate a charge by photoelectric conversion, and a transfer transistor configured to transfer the charge from the photoelectric conversion element to the floating diffusion layer when given an instruction for transfer.

(12) The solid-state imaging element according to any of the above (1) to (11), further including:

a pixel region in which a plurality of pixels each including the pixel circuit is arranged two-dimensionally in a lattice manner, in which the current source circuit includes a logic gate configured to generate the enable signal from a row enable signal indicating a row to be enabled among rows of the pixels and a column enable signal indicating a column to be enabled among columns of the pixels.

(13) The solid-state imaging element according to any of the above (1) to (12), further including:

a pixel region in which a pixel block including a plurality of pixels each including the pixel circuit is arranged, in which the current source circuit includes a logic gate configured to generate the enable signal from a row enable signal indicating a row to be enabled among rows of the pixel block and a column enable signal indicating a column to be enabled among columns of the pixel block, and the plurality of pixels within the pixel block shares the logic gate.

(14) The solid-state imaging element according to any of the above (1) to (13), in which the current source circuit interrupts the constant current when the digital signal is generated.

(15) An imaging device including:

a current source circuit configured to supply a predetermined constant current according to a predetermined enable signal;

a pair of differential transistors configured to generate a differential amplified signal using the constant current, the differential amplified signal being obtained by amplifying a difference between an analog signal generated by a pixel circuit and a predetermined reference signal;

a digital signal generating unit configured to generate a digital signal from the differential amplified signal; and a logic circuit configured to process the digital signal.

REFERENCE SIGNS LIST

100: Imaging device
110: Optical unit
120: DSP circuit
130: Display unit
140: Operating unit
150: Bus
160: Frame memory
170: Storage unit
180: Power supply unit
200: Solid-state imaging element
201: Light receiving chip
202: Circuit chip
210: Pixel region
211: Pixel block
220: Pixel
221: Pixel circuit
222: Reset transistor
223: Floating diffusion layer
224: Transfer transistor
225: Photodiode
226: Discharge transistor
227, 228: Differential transistor
229: Connecting transistor
231, 232: V-driver
233: H-driver
234: DAC
250: AD converter circuit region
261, 262: V-driver
263: H-driver
264: Logic circuit
300: Cluster
310: Comparison result output circuit
320: Differential input circuit
321, 322, 323, 341, 342: P-type transistor
324, 331, 343, 353, 354: N-type transistor
325: Current source transistor
326, 344: NOR (non-conjunction) gate
327: Current source circuit
330: Voltage converter circuit
340: Positive feedback circuit
351, 352, 355: Inverter
360: Data storage unit
370: Time code transfer unit
380: Digital signal generating unit
12031: Imaging section

The invention claimed is:

1. A solid-state imaging element comprising:
a current source circuit configured to supply a predetermined constant current according to an enable signal;
a pair of differential transistors configured to generate a differential amplified signal using the constant current, the differential amplified signal being obtained by amplifying a difference between an analog signal generated by a pixel circuit and a predetermined reference signal;
a digital signal generating unit configured to generate a digital signal from the differential amplified signal, wherein
the current source circuit includes
a current source configured to supply the constant current, and
a switching element configured to open and close a path between the current source and a common node connected in common to the pair of differential transistors according to the enable signal; and wherein
the pixel circuit and a part of the current source circuit are disposed in a predetermined light receiving chip, and
a rest of the current source circuit is disposed in a predetermined circuit chip.

2. The solid-state imaging element according to claim 1, wherein the current source circuit includes
a bias voltage supply circuit configured to supply the bias voltage to the current source according to the enable signal.

3. The solid-state imaging element according to claim 1, wherein
the pixel circuit includes
a photoelectric conversion element configured to generate a charge by photoelectric conversion,
a floating diffusion layer configured to accumulate the charge and generate a signal of a voltage corresponding to an amount of the charge as the analog signal, and a transfer transistor configured to transfer the charge from the photoelectric conversion element to the floating diffusion layer when given an instruction for transfer.

4. The solid-state imaging element according to claim 3, wherein
the pixel circuit further includes a discharge transistor configured to discharge the charge from the photoelectric conversion element when given an instruction for discharge.

5. The solid-state imaging element according to claim 3, further comprising:
a pixel region in which a plurality of pixels each including the pixel circuit is arranged two-dimensionally in a lattice manner, wherein
one of a pair of pixels adjacent to each other within the pixel region further includes a connecting transistor configured to connect the respective floating diffusion layers of the pair of pixels to each other.

6. The solid-state imaging element according to claim 1, further comprising:
a pixel region in which a pixel block including a plurality of pixels each including the pixel circuit is arranged, wherein
the plurality of pixels shares a floating diffusion layer, and the pixel circuit includes
a photoelectric conversion element configured to generate a charge by photoelectric conversion, and
a transfer transistor configured to transfer the charge from the photoelectric conversion element to the floating diffusion layer when given an instruction for transfer.

7. The solid-state imaging element according to claim 1, further comprising:
a pixel region in which a plurality of pixels each including the pixel circuit is arranged two-dimensionally in a lattice manner, wherein
the current source circuit includes a logic gate configured to generate the enable signal from a row enable signal indicating a row to be enabled among rows of the pixels and a column enable signal indicating a column to be enabled among columns of the pixels.

8. The solid-state imaging element according to claim 1, further comprising:
a pixel region in which a pixel block including a plurality of pixels each including the pixel circuit is arranged, wherein
the current source circuit includes a logic gate configured to generate the enable signal from a row enable signal indicating a row to be enabled among rows of the pixel block and a column enable signal indicating a column to be enabled among columns of the pixel block, and
the plurality of pixels within the pixel block shares the logic gate.

9. The solid-state imaging element according to claim 1, wherein
the current source circuit interrupts the constant current when the digital signal is generated.

10. An imaging device comprising:
a current source circuit configured to supply a predetermined constant current according to a predetermined enable signal;
a pair of differential transistors configured to generate a differential amplified signal using the constant current, the differential amplified signal being obtained by amplifying a difference between an analog signal generated by a pixel circuit and a predetermined reference signal;
a digital signal generating unit configured to generate a digital signal from the differential amplified signal;
a logic circuit configured to process the digital signal, wherein
the current source circuit includes
a current source configured to supply the constant current, and
a switching element configured to open and close a path between the current source and a common node connected in common to the pair of differential transistors according to the enable signal; and wherein
the pixel circuit and a part of the current source circuit are disposed in a predetermined light receiving chip, and
a rest of the current source circuit is disposed in a predetermined circuit chip.

11. The imaging device according to claim 10, wherein the current source circuit includes a bias voltage supply circuit configured to supply the bias voltage to the current source according to the enable signal.

12. The imaging device according to claim 10, wherein the pixel circuit includes
a photoelectric conversion element configured to generate a charge by photoelectric conversion,
a floating diffusion layer configured to accumulate the charge and generate a signal of a voltage corresponding to an amount of the charge as the analog signal, and
a transfer transistor configured to transfer the charge from the photoelectric conversion element to the floating diffusion layer when given an instruction for transfer.

13. The imaging device according to claim 12, wherein the pixel circuit further includes a discharge transistor configured to discharge the charge from the photoelectric conversion element when given an instruction for discharge.

14. The imaging device according to claim 12, further comprising:
a pixel region in which a plurality of pixels each including the pixel circuit is arranged two-dimensionally in a lattice manner, wherein
one of a pair of pixels adjacent to each other within the pixel region further includes a connecting transistor configured to connect the respective floating diffusion layers of the pair of pixels to each other.

15. The imaging device according to claim 10, further comprising:
a pixel region in which a pixel block including a plurality of pixels each including the pixel circuit is arranged, wherein
the plurality of pixels shares a floating diffusion layer, and the pixel circuit includes
a photoelectric conversion element configured to generate a charge by photoelectric conversion, and
a transfer transistor configured to transfer the charge from the photoelectric conversion element to the floating diffusion layer when given an instruction for transfer.

16. The imaging device according to claim 10, further comprising:
a pixel region in which a plurality of pixels each including the pixel circuit is arranged two-dimensionally in a lattice manner, wherein the current source circuit includes a logic gate configured to generate the enable signal from a row enable signal indicating a row to be enabled among rows of the pixels and a column enable signal indicating a column to be enabled among columns of the pixels.

17. The imaging device according to claim 10, further comprising:
a pixel region in which a pixel block including a plurality of pixels each including the pixel circuit is arranged, wherein
the current source circuit includes a logic gate configured to generate the enable signal from a row enable signal indicating a row to be enabled among rows of the pixel block and a column enable signal indicating a column to be enabled among columns of the pixel block, and
the plurality of pixels within the pixel block shares the logic gate.

18. The imaging device according to claim 10, wherein the current source circuit interrupts the constant current when the digital signal is generated.

* * * * *